(12) United States Patent
Nakahara

(10) Patent No.: US 11,658,619 B2
(45) Date of Patent: May 23, 2023

(54) GAIN TRANSIENT RESPONSE COMPENSATION

(71) Applicant: NOKIA TECHNOLOGIES OY, Espoo (FI)

(72) Inventor: Hideki Nakahara, Kawasaki (JP)

(73) Assignee: NOKIA TECHNOLOGIES OY, Espoo (FI)

( * ) Notice: Subject to any disclaimer, the term of this patent is extended or adjusted under 35 U.S.C. 154(b) by 192 days.

(21) Appl. No.: 17/254,668

(22) PCT Filed: Jun. 19, 2018

(86) PCT No.: PCT/EP2018/066224
§ 371 (c)(1),
(2) Date: Dec. 21, 2020

(87) PCT Pub. No.: WO2019/242842
PCT Pub. Date: Dec. 26, 2019

(65) Prior Publication Data
US 2021/0226590 A1     Jul. 22, 2021

(51) Int. Cl.
*H03F 1/32* (2006.01)
*H03F 3/24* (2006.01)
*H03G 3/30* (2006.01)

(52) U.S. Cl.
CPC ............ *H03F 1/3247* (2013.01); *H03F 3/24* (2013.01); *H03G 3/3047* (2013.01); *H03F 2200/336* (2013.01); *H03F 2200/451* (2013.01)

(58) Field of Classification Search
CPC .... H03F 1/3247; H03F 3/24; H03F 2200/336; H03G 3/3042; H03G 3/3047

USPC ......................................................... 330/149
See application file for complete search history.

(56) References Cited

U.S. PATENT DOCUMENTS

| 2005/0190857 A1 | 9/2005 | Braithwaite |
| 2010/0222015 A1 | 9/2010 | Shimizu et al. |
| 2013/0223565 A1 | 8/2013 | McCallister |

(Continued)

FOREIGN PATENT DOCUMENTS

JP    2004-112218 A    4/2004

OTHER PUBLICATIONS

International Search Report & Written Opinion dated Mar. 21, 2019 corresponding to International Patent Application No. PCT/EP2018/066224.

(Continued)

*Primary Examiner* — Hafizur Rahman
*Assistant Examiner* — Khiem D Nguyen
(74) *Attorney, Agent, or Firm* — Squire Patton Boggs (US) LLP

(57) ABSTRACT

A method, apparatus and computer program is described comprising: determining an absolute gain of a power amplifier over time, wherein the absolute gain is formed from the division of a feedback baseband signal derived (e.g. by demodulating an RF signal) from an output of the power amplifier, by a forward baseband signal that is used to form an input of the power amplifier; determining a relative gain transient response (GTR) of the power amplifier, by normalising the absolute gain to generate a relative gain of the power amplifier over time; and determining a transient response compensation value having inverse characteristics to the relative gain transient response.

19 Claims, 27 Drawing Sheets

(56) References Cited

U.S. PATENT DOCUMENTS

2014/0253232 A1  9/2014  Oishi
2017/0063406 A1  3/2017  Utsunomiya et al.

OTHER PUBLICATIONS

Examination Report dated Jul. 12, 2021 corresponding to Indian Patent Application No. 202017052933.

Absolute Gain Transient Response in the case of variation of symbol power

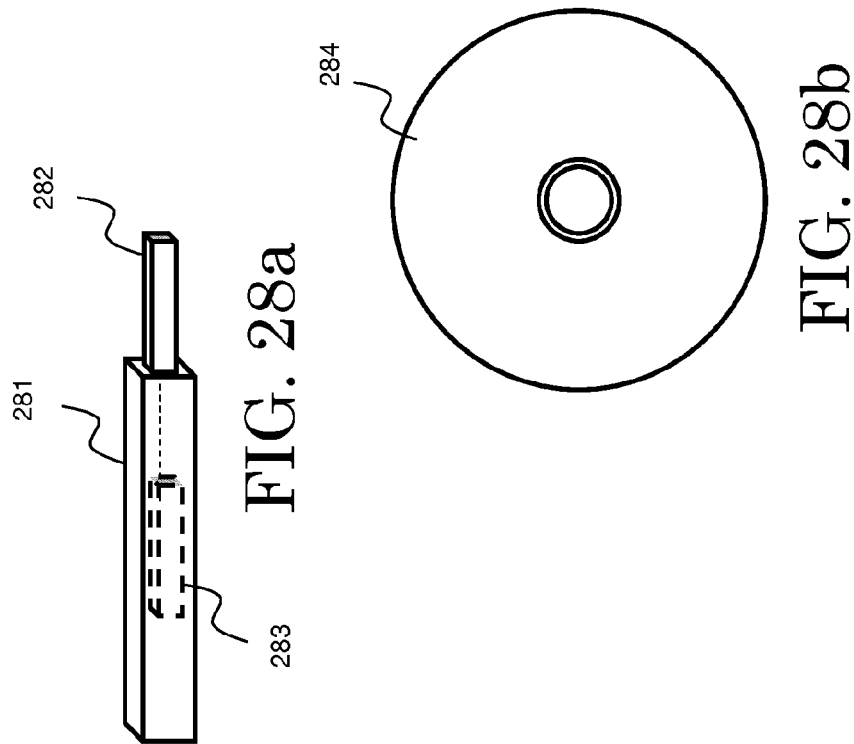

GAIN TRANSIENT RESPONSE COMPENSATION

FIELD

The present specification relates to transient response compensation of a power amplifier, for example to a power amplifier that forms part of a communication system.

BACKGROUND

In some application, power amplifiers, such as power amplifiers in a transmission system, output data in framed burst signals. Transient variation may occur in the event that the gain of the amplifier is not stable over the duration of each burst.

SUMMARY

In a first aspect, this specification describes an apparatus comprising: means for determining an absolute gain of a power amplifier over time, wherein the absolute gain is formed from the division of a feedback baseband signal derived (e.g. by demodulating an RF signal) from an output of the power amplifier, by a forward baseband signal that is used to form (e.g. following modulation to convert to RF) an input of the power amplifier; means for determining a relative gain transient response (GTR) of the power amplifier, by normalising the absolute gain to generate a relative gain of the power amplifier over time; and means (e.g. a transient response calculation unit) for determining a gain transient response compensation coefficient having inverse characteristics to the relative gain transient response.

The means for determining the absolute gain of the power amplifier over time may comprise means for averaging the division of the feedback baseband signal by the forward baseband signal over successive sample intervals (e.g. an average absolute gain may be generated for each sample).

The means for determining the relative gain transient response of the power amplifier may comprise means for normalising the absolute gain relative to a reference gain. The said reference gain may be determined at a time at which the absolute gain is deemed to have settled. The said reference gain may be determined at a time at which the absolute gain is determined to have settled. Furthermore, there may be provided means for determining a time at which the absolute gain is determined to have settled, said means comprising a reference detection unit configured to determine a sample period during which power levels of the forward baseband signal have maximal stability.

Some embodiments may include means (e.g. a transient pre-compensation unit) for modifying the baseband forward signal using the determined gain transient response compensation coefficient to generate a compensated baseband forward signal (thereby compensating for the gain transient response of the power amplifier). For example, the said baseband forward signal may be multiplied by the determined gain transient response compensation coefficient to generate the compensated baseband forward signal.

Some embodiments may include means (e.g. a gain transient response compensation value update and retain unit) for storing and updating the gain transient response compensation coefficient. The means for storing and updating the gain transient response compensation coefficient may update the gain transient response compensation coefficient depending on a length of a further compensation coefficient.

A common update period index (s_com) may be determined in accordance with the following relationship of a reference index of previous coefficient (s_ref_pre) and that of current residual gain (s_ref):

$s\_ref = s\_ref\_pre \Rightarrow s\_com = s\_ref$ $s\_ref < s\_ref\_pre \Rightarrow s\_com = s\_ref$ $s\_ref > s\_ref\_pre \Rightarrow s\_com = s\_ref\_pre.$ wherein: the gain transient compensation coefficients are updated for the common update period, calculated by using the previous compensation coefficient and the current residual gain in the common update period, where the error of the current residual gain is calculated by the difference from the residual gain of the index (s_com), controlled by multiplying update-coefficient to the error; and a portion of coefficients that are out of a common update period, and whose length is longer than portions of previous compensation coefficient or current residual gain coefficient, are combined with the updated coefficients in the common period.

In some embodiments, the feedback baseband signal is a complex signal having in-phase and quadrature components and/or the forward baseband is a complex signal having in-phase and quadrature components and/or the baseband forward signal is a complex signal having in-phase and quadrature components.

The power amplifier may be an RF signal amplifier unit (e.g. for a wireless transmission apparatus that transmits burst signals).

The input signal of the apparatus may be a burst mode signal (such that the power amplifier is a burst mode power amplifier).

The said means may comprise: at least one processor; and at least one memory including computer program code, the at least one memory and computer program code configured to, with the at least one processor, cause the performance of the apparatus.

In a second aspect, this specification describes a method comprising: determining an absolute gain of a power amplifier over time, wherein the absolute gain is formed from the division of a feedback baseband signal derived from an output of the power amplifier, by a forward baseband signal that is used to form an input of the power amplifier; determining a relative gain transient response of the power amplifier, by normalising the absolute gain to generate a relative gain of the power amplifier over time; and determining a gain transient response compensation coefficient having inverse characteristics to the relative gain transient response.

Determining the absolute gain of the power amplifier over time may comprise averaging the division of the feedback baseband signal by the forward baseband signal over successive sample intervals (e.g. an average absolute gain may be generated for each sample).

Determining the relative gain transient response of the power amplifier may comprise normalising the absolute gain relative to a reference gain. The said reference gain may be determined at a time at which the absolute gain is deemed to have settled. The said reference gain may be determined at a time at which the absolute gain is determined to have settled. Furthermore, there may be provided means for determining a time at which the absolute gain is determined to have settled, said means comprising a reference detection unit configured to determine a sample period during which power levels of the forward baseband signal have maximal stability.

The method may further comprise modifying the baseband forward signal using the gain transient response compensation coefficient to generate a compensated baseband forward signal (thereby compensating for the gain transient response of the power amplifier).

In a third aspect, this specification describes an apparatus configured to perform any method as described with reference to the second aspect.

In a fourth aspect, this specification describes computer readable instructions which, when executed by computing apparatus, cause the apparatus to perform a method as described with reference to the second aspect.

In a fifth aspect, this specification describes a computer program comprising instructions stored thereon for performing at least the following: determining an absolute gain of a power amplifier over time, wherein the absolute gain is formed from the division of a feedback baseband signal derived from an output of the power amplifier, by a forward baseband signal that is used to form an input of the power amplifier; determining a relative gain transient response of the power amplifier, by normalising the absolute gain to generate a relative gain of the power amplifier over time; and determining a gain transient response compensation value having inverse characteristics to the relative gain transient response. The computer program may further comprise instruction stored thereon for modifying the baseband forward signal using the gain transient response compensation value to generate a compensated baseband forward signal (thereby compensating for the gain transient response of the power amplifier).

BRIEF DESCRIPTION OF THE DRAWINGS

Example embodiments will now be described, by way of example only, with reference to the following schematic drawings, in which:

FIGS. 28a and 28b show tangible media, respectively a removable memory unit and a compact disc (CD) storing computer-readable code which when run by a computer perform operations according to embodiments.

DETAILED DESCRIPTION

Figure 1A:
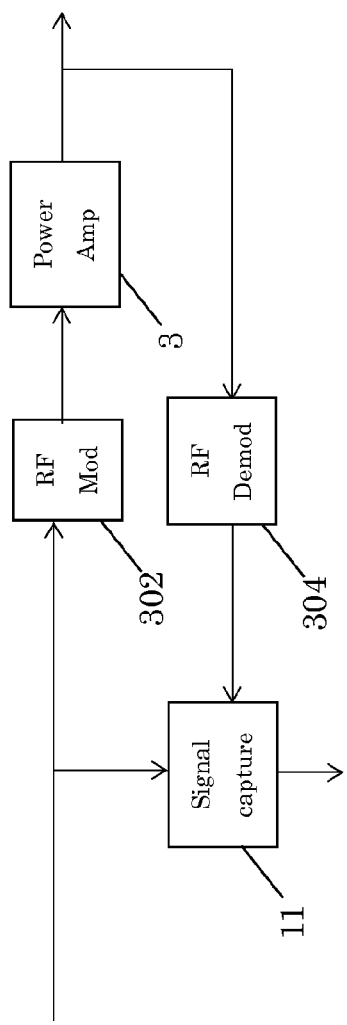
FIG. 1a is a block diagram of a system in accordance with an example embodiment.

FIG. 1a is a block diagram of a system, indicated generally by the reference numeral A10, in accordance with an example embodiment. The system A10 comprises a RF modulation circuit 302, an RF demodulation circuit 304, a power amplifier 3 and a signal capture circuit 11.

The system A10 receives a forward IQ signal that is modulated by RF modulation circuit 302 to provide a radio frequency (RF) signal that is provided to the power amplifier 3. The power amplifier 3 amplifies the RF signal to provide an RF output. The forward IQ signal is provided as a first input to the signal capture circuit 11. The RF output is demodulated by RF demodulation circuit 304 and the resulting feedback IQ signal is provided as a second input to the signal capture circuit 11.

As described in detailed below, the forward IQ signal and the feedback IQ signal can be compared in order to determine aspects of the characteristics of the power amplifier 3.

Figure 1B:
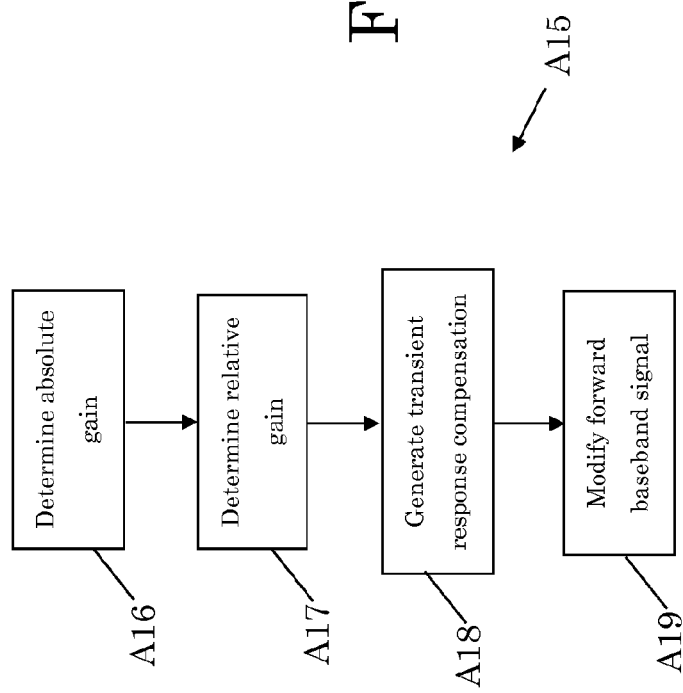
FIG. 1B is a flow chart showing an algorithm in accordance with an example embodiment.

FIG. 1b is a flow chart showing an algorithm, indicated generally by the reference numeral A15 in accordance with an example use of the system A10. The algorithm A15 starts at operation A16 where the feedback IQ signal is divided by the forward IQ signal to provide an absolute gain of the power amplifier 3. Next, at operation A17, the absolute gain is normalised to generate a relative gain transient response of the power amplifier 3 over time. At operation A18, a gain transient response compensation value for the power amplifier 3 is generated. Finally, at operation A19, the generated gain transient response compensation value may be used to modify the forward IQ signal to compensate for the gain transient response of the power amplifier 3. Further details of the functionality and implementation of the operations A16 to A19 are provided below.

Figure 2:
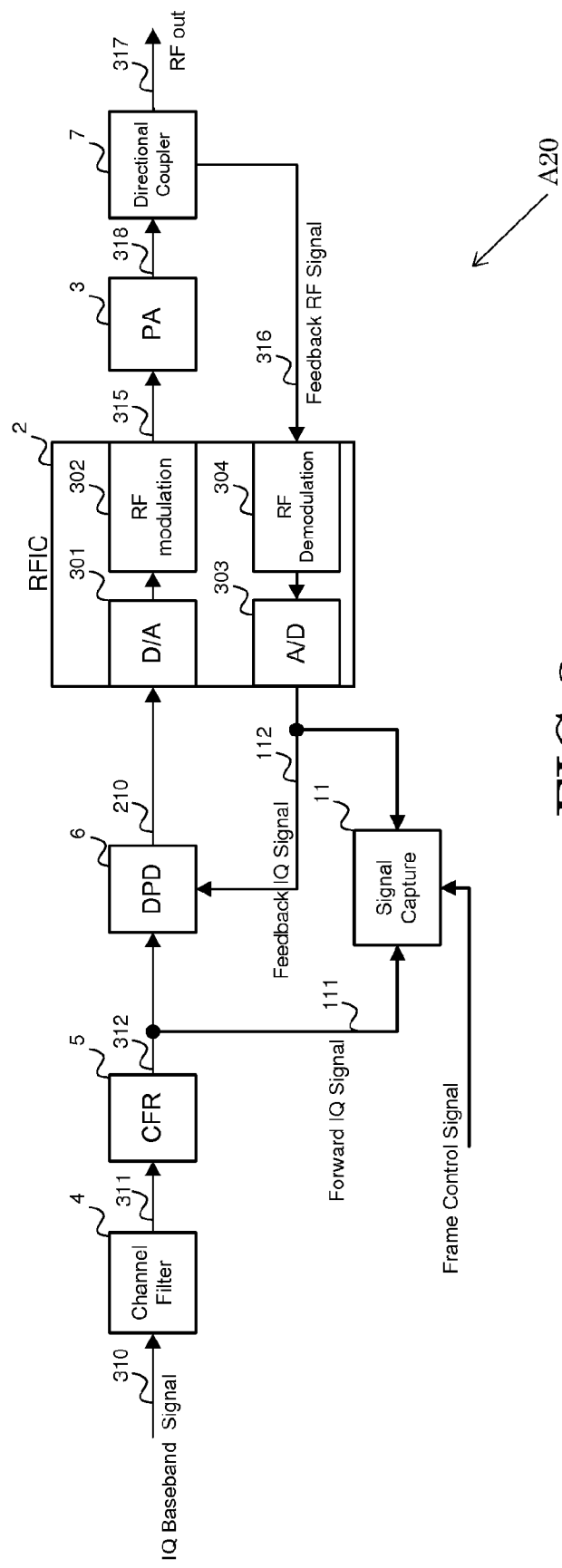
FIG. 2 is a block diagram of a system in accordance with an example embodiment.

FIG. 2 is a block diagram of a system, indicated generally by the reference numeral A20, in accordance with an example embodiment. The system A20 may, for example, be a wireless transmission apparatus for investigating transient response of a power amplifier. As described in detail below, the apparatus A20 includes the RF modulation circuit 302, RF demodulation circuit 304, power amplifier 3 and signal capture circuit 11 of the system A10 described above.

The system A20 illustrates the generation of transient response characteristics related to the power amplifier 3. The system A20 comprises a channel filter unit 4 filtering an input waveform (IQ baseband signal 310 as shown in FIG. 2) to a transmit channel band; crest factor reduction (CFR) circuit 5, which suppress peaks in the IQ baseband signal; digital pre-distortion (DPD) circuit 6, which can be used to compensate for distortion of the power amplifier; the power amplifier 3, which amplifies a transmit signal; directional coupler 7, to obtain an RF feedback signal of the RF output signal; the signal capture circuit 11; and Radio Frequency Integrated Circuit (RFIC) 2, which includes a digital-to-analog (D/A) converter 301 and the RF modulation circuit 302 for converting the complex baseband IQ signal to an RF signal of a desired carrier frequency for transmission and the RF demodulation circuit 304 and a digital-to-analog converter 303 for converting an RF feedback signal to a complex baseband signal.

The signal capture unit 11 captures the forward IQ signal and the feedback IQ signal for calculating gain transient response (GTR) characteristics (thereby implementing the operation A16 described above). Here, the feedback IQ signal, which is converted from an RF feedback signal to a complex baseband signal by the RF demodulator 304 and A/D converter 303, contains the same GTR characteristics as RF output, is used for calculating GTR.

Figure 3:
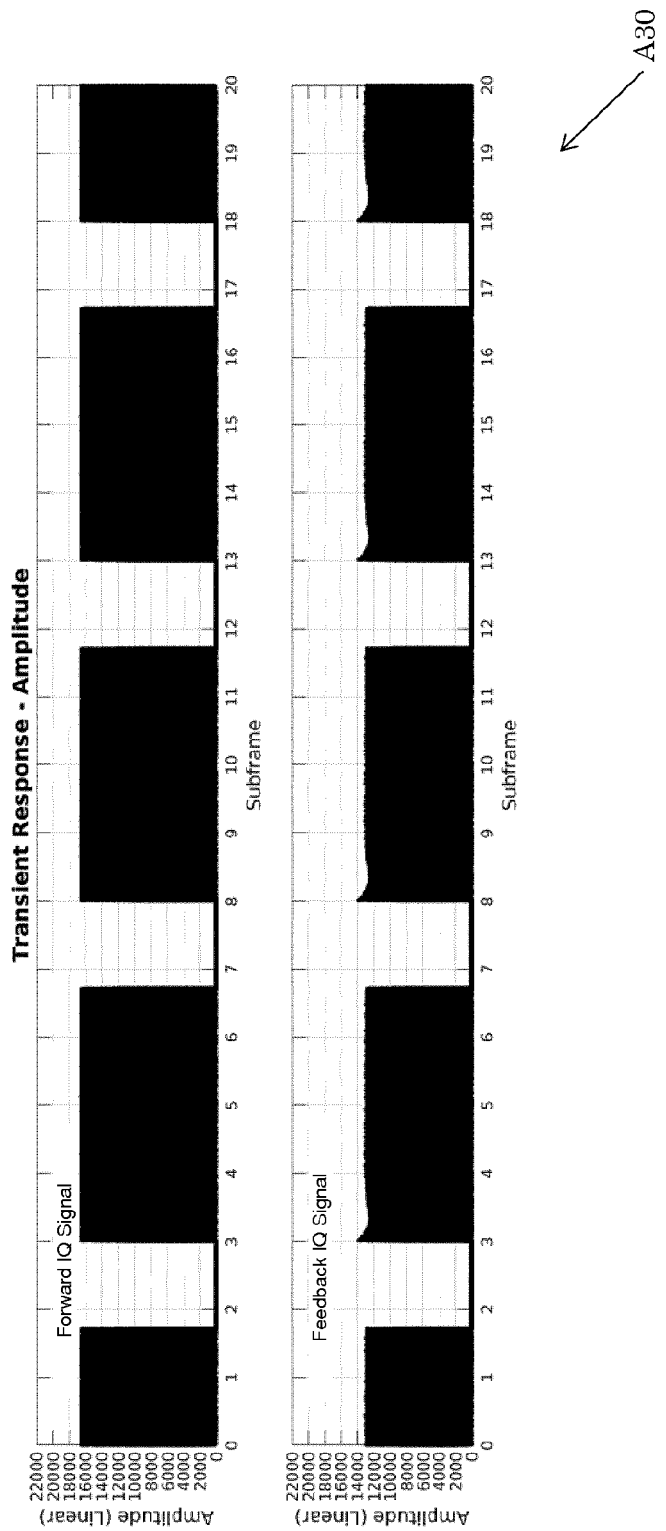
FIG. 3 shows outputs generated in an example use of the systems of FIGS. 1 and 2.

FIG. 3 shows outputs, indicated generally by the reference numeral A30, generated in an example use of the systems A10 and A20 described above. The outputs A30 show a time series of amplitudes of the forward IQ signal and feedback IQ signal.

The amplitude of the forward IQ signal (shown in the upper figure of FIG. 3) has a peak level that is constant (as a result of the processing applied by the CFR circuit 5). The amplitude of the feedback IQ signal (shown in the lower figure of FIG. 3) has a peak level having a variable amplitude variation at the beginning of each burst.

A method of calculating the GTR precisely using the forward IQ signal and the feedback IQ signal is provided in the following example embodiments.

The amplitude of the forward IQ signal varies sample by sample because the forward IQ signal is a modulated signal having a bandwidth, here LTE 20 MHz bandwidth is shown. A sample timing adjustment between two signals, for example a first signal and a second signal (such as the feedback IQ signal and the forward IQ signal), may be needed in advance to calculate a gain inherent between two signals. M times up-sampling and convolutional processing is performed, and the sample timing is adjusted at the rate of M times from original sampling rate with an estimated timing difference. A timing adjustment is performed between the first signal and a second signal after up-sampling. The procedure described herein for timing adjustment is for illustration purposes only. An outline of the timing adjustment is shown in equation E1 below.

A sample index before the M times up-sampling is denoted by t, and a sample index after the M times up-sampling is denoted by m. As such, the first signal before the M times up-sampling is denoted by Sb(t), and the first signal after the M times up-sampling is denoted by Sb (m). As such, the second signal before the M times up-sampling is denoted by Sf(t), and the second signal after the M times up-sampling is denoted by Sf (m). "Nsp" represents n-th sample, i.e. the sufficient number of samples to compensate GTR from the beginning of each burst.

E1:

$$Sb(t) \Rightarrow Mx \text{ Up-sampling} \Rightarrow Sb(m)$$

$$Sf(t) \Rightarrow Mx \text{ Up-sampling} \Rightarrow Sf(m)$$

Before up-sampling: $t=1, \ldots, Nsp$

After up-sampling: $m=1, \ldots, Nsp \times M$ (1)

After the timing adjustment between the first signal and the second signal in high resolution, the up-sampled first signal Sb (m) and the up-sampled second signal Sf (m) is proceeded in equation E2. A timing deference between the first signal and a second signal in the up-sampled time series is denoted by Δm. A convolutional process function is denoted by "*". The convolutional process function is for detecting timing deference (denoted by U(Δt)) by a peak of the output of the function.

E2:

$$U(\Delta t)=|Sf(m)*Sb(m-\Delta t)|$$

$$\Delta m = \arg \max\{U(\Delta t)\} \Delta t=1, \ldots, Nsp \times M \quad (2)$$

A down-sampling is then performed with a rate of "1/M" times for recovering the original sampling rate, as illustrated in equation E3. The down-sampled signals after timing adjustment of the first signal and the second signal are denoted by Sf(i), Sb(i) respectively, where the sample index is denoted by "i". The range of the sample index is from one to Nsp (i=1, ..., Nsp).

E3:

$$Sb(m-\Delta m) \Rightarrow (1/M) \times \text{Down-sampling} \Rightarrow Sb(i)$$

$$Sf(m) \Rightarrow (1/M) \times \text{Down-sampling } Sf \Rightarrow (i) \ i=1, \ldots, Nsp \quad (3)$$

The down-sampled signal Sf(i) is the forward IQ signal that is obtained after the down-sampling. The down-sampled signal Sb(i) is the feedback IQ signal obtained after the down-sampling. The sample timing may be adjusted at the sample index denoted by "i".

In this example embodiment, the rate M is set to eight. However, there is no limitation that the rate M should be eight.

Equation E4 illustrates a division processing. The division processing is performed in order to calculate an absolute GTR. The absolute GTR, as denoted by "aG(i)" is the gain of the feedback IQ signal against the forward IQ signal as a reference (see the operation A16 described above).

E4:

$$aG(i)=Sb(i)/Sf(i) \ i=1, \ldots, Nsp \quad (4)$$

Figure 4:
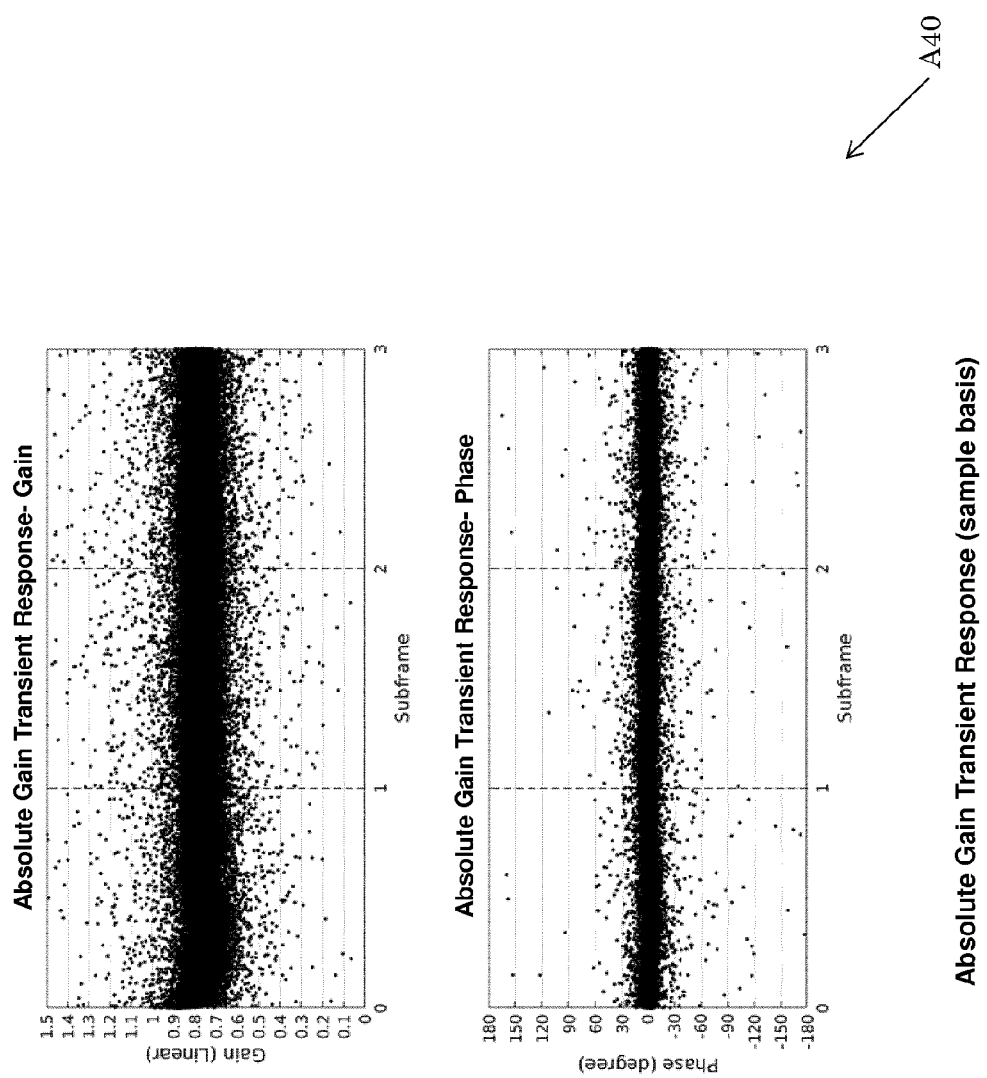
FIG. 4 shows outputs generated in an example use of the systems of FIGS. 1 and 2.

FIG. 4 shows outputs, generally indicated by reference numeral A40, generated in an example use of the systems A10 and A20. The outputs show absolute gain transient response (GTR) for each sample calculated by forward IQ signal and feedback IQ signal. The upper part of outputs A40 illustrates amplitude components, and the lower part of outputs A40 illustrates the phase components. The division of Sb(i) by Sf(i) is a division of vectors, and therefore any process errors incurred in the output may depend on an amplitude scale of the sample. As shown in FIG. 4, the errors lead to a relatively wide spread of data points.

In one variant, an average absolute GTR ("aG_ave") is calculated using an absolute gain of a sample basis and a predetermined sample interval ("Nd"), as shown below in equation E4a. In equation E4a, an index of the sample interval, i.e. an interval index is denoted by "u", and the average absolute GTR for the sample interval is denoted by aG_ave(u). A target sample index for averaging at the interval index "u" is denoted by i_itv(u), where i_itv(u) ranges from i_start(u) to i_end(u) (i_itv(u)=i_start(u), i_end (u)). The number of samples for averaging at the interval index "u" is denoted by Nave(u) (Nave(u)=i_end(u)−i_start(u)+1).

E4a:

$$\text{Averaged absolute } GTR\text{: } aG\_ave(u) = \left\{ \sum_{i_{start(u)}}^{i_{end(u)}} aG(i\_itv(u)) \right\} / Nave(u) \quad (4a)$$

Figure 5:
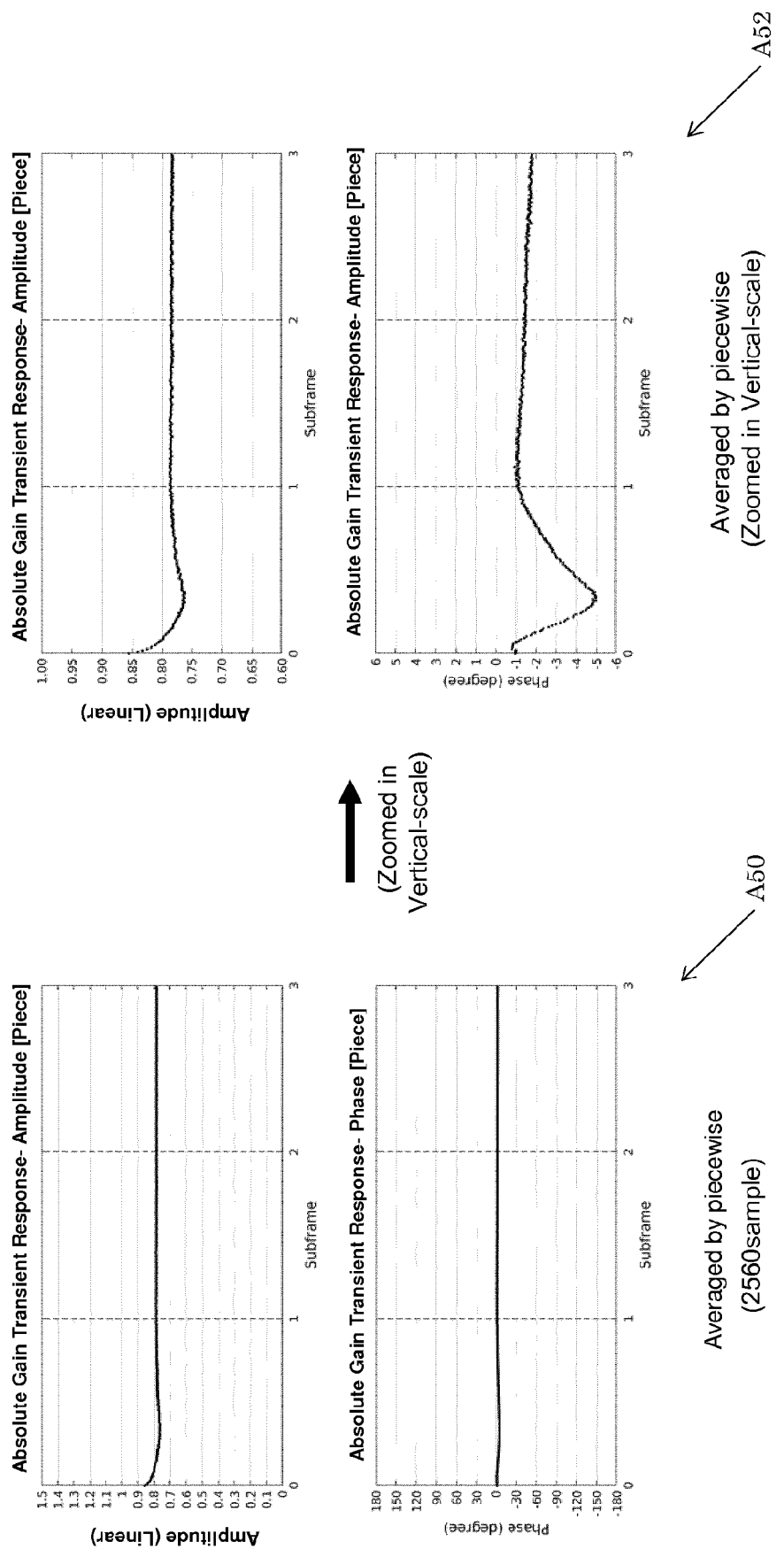
FIG. 5 shows data points generated in an example use of the systems of FIGS. 1 and 2.

FIG. 5 shows data points, indicated generally by reference numerals A50 and A52, generated in an example use of the systems A10 and A20. The data points A50 and A52 illustrate absolute GTR averaged for each interval.

Data points A50 illustrates piecewise average absolute GTR for a sample basis and a predetermined sample interval length ("Nd"), as calculated in equation E4a. In the FIG. 5, Nd is 2560 (as an example). Scaling of the vertical axes (representing amplitude component (upper part) or phase component (lower part)) in the illustration of data points A50 is same as that of example outputs A40. Data points A52 are same as data points A50. Scaling of the vertical axes in the illustration of data points A52 is larger than that of A50, such that A52 is zoomed in to focus on the variation of each data point along the vertical axes. According to data points A52, both the amplitude and the phase vary in the range of one subframe. A subframe consists of fourteen orthogonal frequency-division multiplexing (OFDM) symbols.

In an example embodiment, when performing a compensation of GTR of an RF output in advance using GTR characteristics obtained in the above embodiments (the operation A19 of the algorithm A15 described above), inverse GTR characteristics may be used as compensation coefficient series for GTR compensation (GTC), and the transmit signal may be compensated in advance before input to the digital-to-analog (D/A) converter 301 by using the compensation coefficient series. The compensation coefficient series is described below. For simplicity, a term "symbol" is used for representing OFDM symbol, a term "symbol gain" is used for representing average gain for an OFDM symbol, and a term "symbol power" is used for representing average power for an OFDM symbol.

In an example embodiment, the compensation coefficient series is determined using the number of coefficients, a time interval compensated by a coefficient, and the compensation range from the beginning of a burst represented by a predefined time period. There are three parameters, namely a first, second and third parameter, for calculating the compensation coefficient series. The first parameter is a time interval from the beginning of a burst to the time when compensation is performed. The second parameter is the number of compensation coefficients. The third parameter is a length of the time interval compensated by the compensation coefficient.

In one variant, regarding the first parameter, in order to reduce computational load related to compensation, compensation may not be performed for all signals in the whole time interval from the beginning of the burst. The time interval used may be a time interval during which the transient response occurs, which may reduce the number of compensation coefficients to be used in the compensation coefficient series. Regarding the second parameter and the third parameter, an interval averaged value for a symbol of sample basis transient response is calculated, such that one compensation coefficient is provided for each symbol.

For example, as illustrated in data points A50 and A52, the GTR is converged within one subframe length, which is approximately equivalent to a range from a starting symbol to a fourteenth symbol. Therefore, the absolute gain of a fifteenth symbol is taken as a reference gain (and can be used for normalization, as discussed further below). A series of relative GTR is obtained as relative deference against the absolute gain of the fifteenth symbol as a reference.

For the purposes for the example embodiments provided, the gain characteristics are regarded as the relative gain transient characteristics. For the absolute gain, the normalization in the forward portion by the reference gain is processed. The reference gain is taken from the absolute gain in the region where the transient response is converged.

The inverse characteristics of the relative GTR, used for compensating the GTR in advance, are described below. As discussed above, the inverse characteristics of the relative GTR is calculated as compensation coefficient series. The baseband IQ signal to be transmitted is compensated in advance by using the compensation coefficients.

In an example embodiment, the averaged value in the interval of symbol duration from sample based absolute gain (aG(i)) is calculated according to equation E5, as illustrated below. A symbol based absolute GTR, for a predetermined number of symbols (Nsym), is denoted by aG_ave(s). The symbol index is denoted by "s". For illustration purposes, the predetermined number of symbols Nsym is equal to fifteen. The absolute gain is calculated for the predetermined number of symbols from the symbol in the beginning. A target sample index for averaging at the symbol index "s" is denoted by i_sym(s), where i_sym(s) ranges from i_start(s) to i_end(s) (i_itv(u)=i_start(u), i_end(u)). The number of samples for averaging at the symbol index "s" is denoted by Nave(s) (Nave(s)=i_end(s)−i_start(s)+1).

E5:

$$\text{Symbol absolute } GTR\text{: } aG\_ave(s) = \left\{ \sum_{i_{start(s)}}^{i_{end(s)}} aG(i_{sym}(s)) \right\} / Nave(s) \quad (5)$$

Symbol index: s=1, . . . ,Nsym

After calculating the symbol based absolute GTR, the symbol absolute gain transient response from the start symbol to the symbol before the reference symbol are normalized based on a division shown in equation E6. The absolute gain aG_ave(s_ref) is used as a reference symbol (s_ref is equal to fifteen in this example).

E6:

Symbol basis relative GTR: rG_ave(s)=aG_ave(s)/aG_ave(s_ref)

s=1, . . . ,s_ref          (6)

Figure 6:
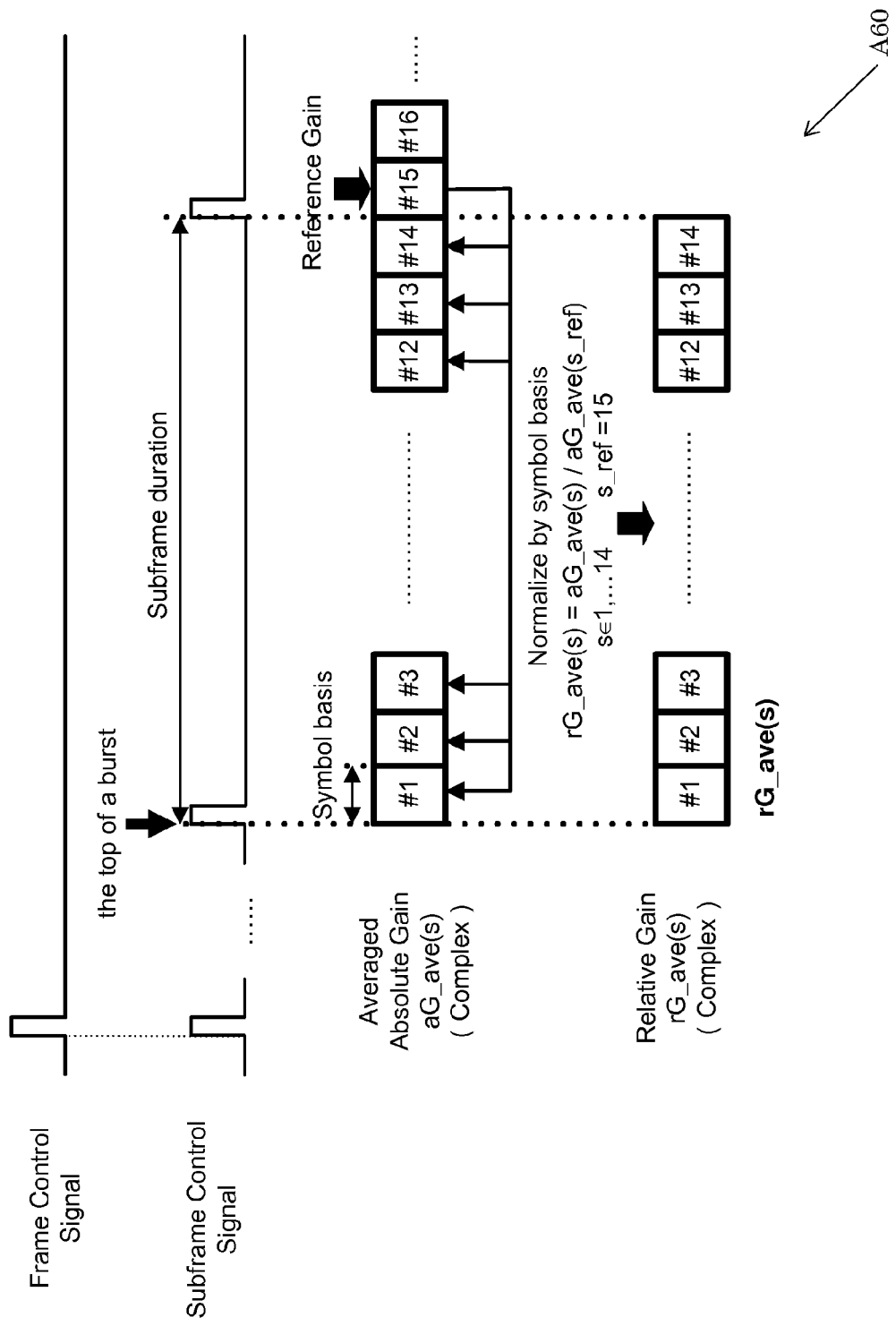
FIG. 6 is a block diagram of a system in accordance with an example embodiment.

FIG. 6 is a block diagram of a system, indicated generally by the reference numeral A60, in accordance with an example embodiment. System A60 provides a procedure of calculating relative gain. Therefore, symbol basis relative GTR rG_ave(s) is calculated with the gain relative to detected reference gain.

As shown in FIG. 6, the subframe control signal denotes the start of a burst. The fifteenth symbol of the burst (in this example embodiment) is taken as the reference gain and used in the conversion of the average absolute gain to provide the relative gain (operation A17 as described above).

Figure 7:
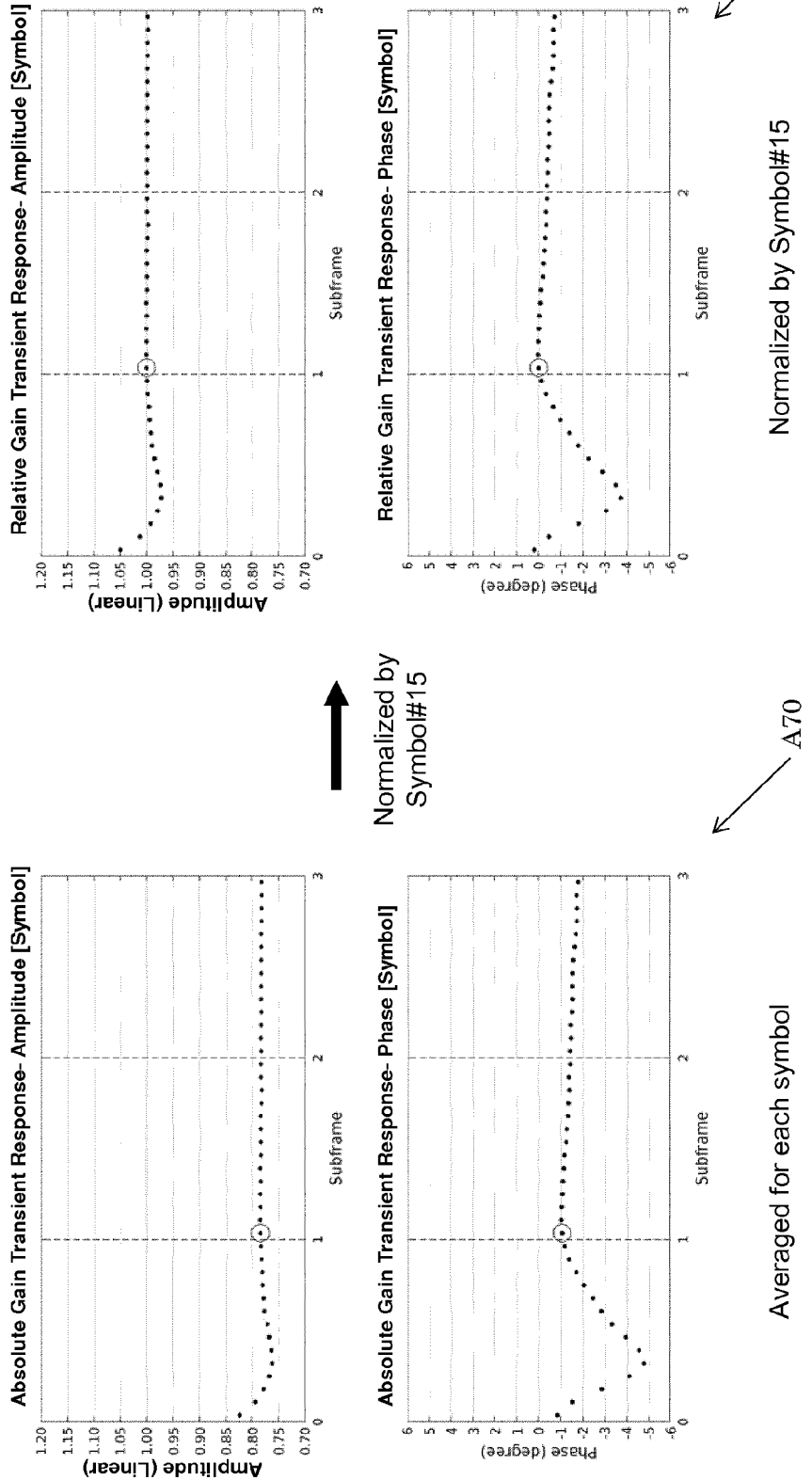
FIGS. 7, 8, 9a, 9b, 10a and 10b show data generated in example embodiments.

FIG. 7 shows data generated, generally indicated by the reference numerals A70 and A72, in accordance with an example embodiment. Data A70 illustrates absolute GTR for each symbol (operation A16). The absolute GTR shows symbol basis gain of feedback IQ signal as reference with the forward IQ signal. The upper part of A70 and A72 illustrates the amplitude component of the complex gain, and the lower part of A70 and A72 illustrates the phase component of the complex gain. Data A72 illustrates relative GTR for each symbol (operation A17). The relative GTR shows the gain in the absolute GTR normalized by the fifteenth symbol of the absolute gain as the reference gain. As shown in data A72, the amplitude component (upper part) is one for the fifteenth symbol and the phase component is zero for the fifteenth symbol. Both the amplitude component and the phase component are shown to be varying up to approximately the fourteenth symbol. The amplitude component decreases at the fifth symbol. The amplitude component of the fifth symbol is 0.975, which is the lowest value for the given symbols. The amplitude component continues to increase after the fifth symbol, and approaches the value of one. The phase has a maximum error at the fifth symbol and then increases towards zero.

Figure 8:
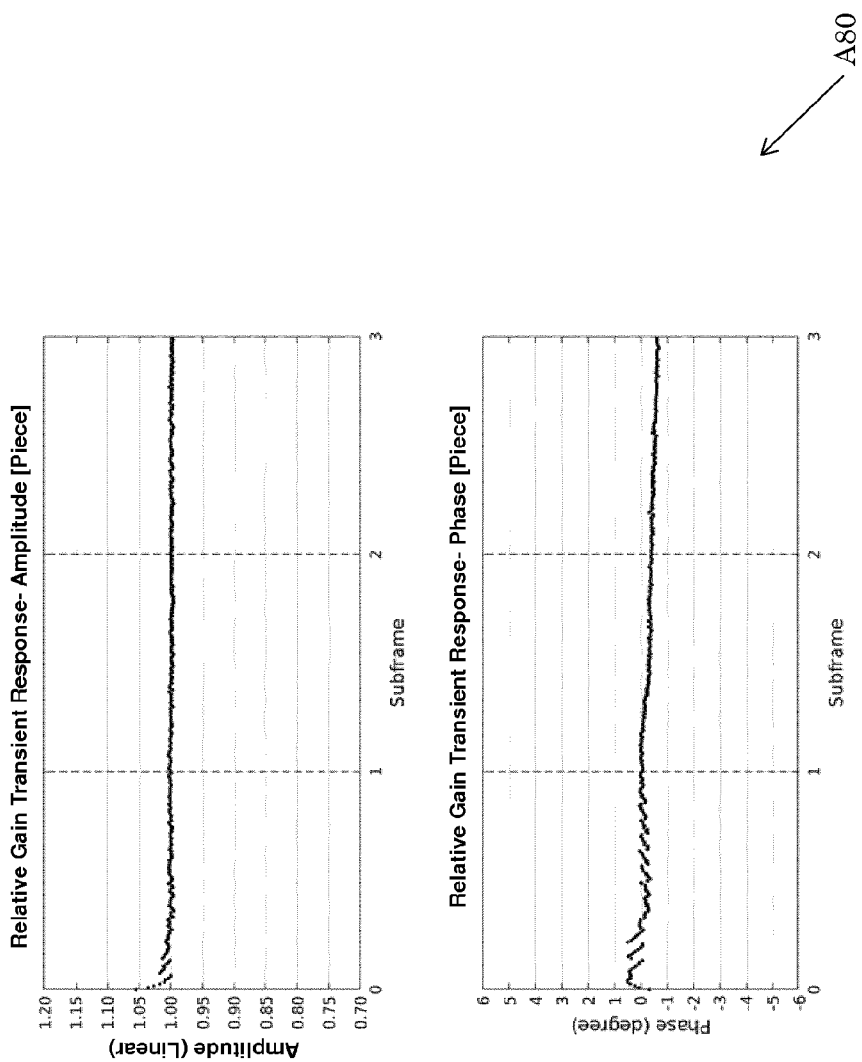

FIG. 8 shows data generated, generally indicated by the reference numeral A80, in accordance with an example embodiment. As illustrated above, characteristics of the relative GTR change after performing the compensation. Consequently, the relative GTR becomes closer to a gain value where the amplitude component is one and the phase component is zero.

In the example embodiments above, one of the benefits of detecting a position of reference gain and normalizing the forward portion of the absolute gain is that the response is compensated without non-continuity in the RF output signal, between a forward compensated portion of the reference symbol and a backward non-compensated portion of the reference symbol. This is because the amplitude and phase of the gain is "1" and "0" respectively in the reference symbol.

FIGS. 9a, 9b, 10a, and 10b shows data generated, indicated generally by reference numerals A90, A92, A100 and A102 respectively, in accordance with an example embodiment. Data A90 and A100 illustrates measurement results of a constellation of an RF output signal, and data A92 and A102 illustrates measurement results of a symbol error vector magnitude (EVM) of RF output signal. Data A90, A92, A100 and A102 collectively illustrate an effect of the gain transient response compensation described herein.

Figure 9A:
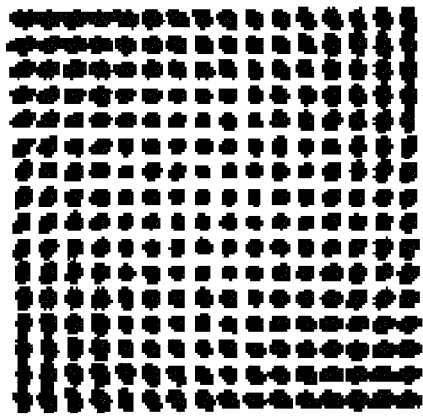
Figure 9B:
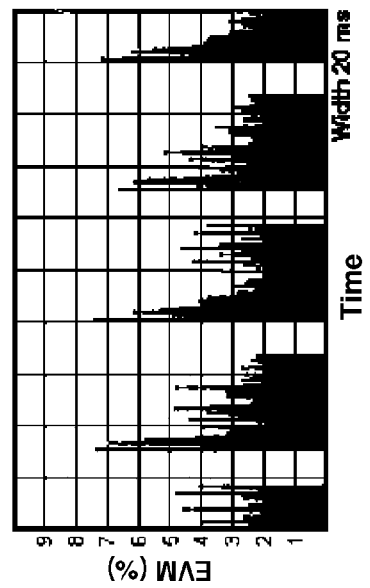

FIGS. 9a and 9b shows outputs A90 and A92, where compensation has not been performed. As illustrated, the transient response makes an impact on the beginning of the burst in which the degradation of the symbol error vector magnitude (EVM) can be seen. As a result, both amplitude component and phase component of signal points in the constellation deviate gradually in time transient from ideal signal points. It should be noted that if the deviation of signal points incurred in a transmitter side and the deviation cannot be corrected in a demodulation process at a receiver side, bit detection of the signal point will include errors and the throughput performance would be degraded.

Figure 10A:
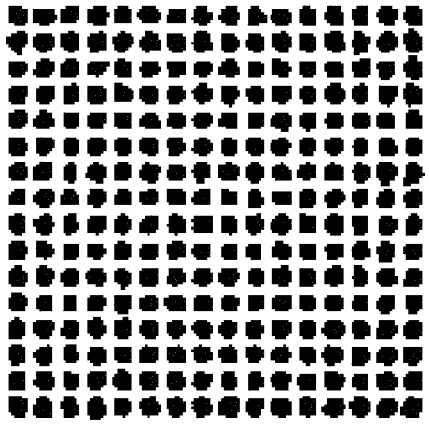
Figure 10B:
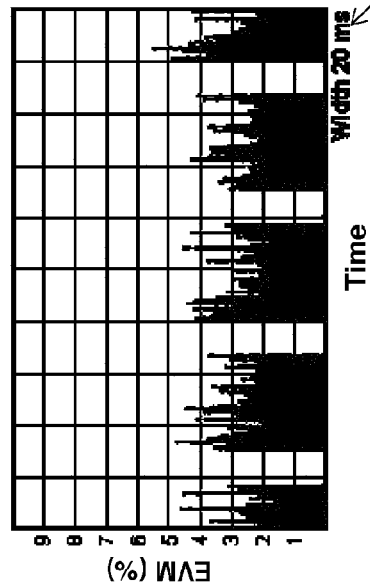

FIGS. 10a and 10b shows outputs A100 and A102, where compensation has been performed in advance by multiplying the compensation coefficients to the IQ baseband signal 310 to be transmitted. As illustrated, the symbol error vector magnitude (EVM) and the deviation of the signal point in the constellation are improved. As such, the improvement of symbol EVM is obtained by compensation of GTR in advance using the compensation coefficient based on inverse characteristics of relative GTR.

Thus, the transient response characteristics of RF output signal shown in FIG. 3 can be obtained by calculating the relative GTR referenced by the specific portion of complex absolute gain in time series where the transient is response converged. Regarding the calculation of the relative gain, the process of timing adjustment at the high ("M" times) sampling rate brings the high accuracy in gain calculation in terms of both amplitude and phase. Furthermore, the GTR of RF output signal can be compensated by multiplying the inverse characteristics of the relative GTR to IQ baseband signal to be transmitted in advance.

The compensation in the above example embodiments can be performed using digital signal processing which can be implemented in integrated Circuit (IC) device, such as Field-programmable gate array (FPGA), digital signal processor (DSP) device, and SoC (System on Chip). It should also be noted that the provision of the RFIC unit 2 represents one example implementation. By way of example only, an alternative implementation might implement the features of the RFIC unit in other ways, for example as part of an IC device implementing the other features of the system A20.

In order, for example, to overcome the problems in mass production and actual operation, it may be necessary to update the compensation coefficients adaptively. A GTR compensation circuit for adaptively updating the compensation coefficients is provided below in accordance with example embodiments.

Unless otherwise stated, Test model of LTE E-TM3.1a (Band width: 20 MHz) is also used here for the test signal.

The transient response characteristics of RF output may be affected by temperature and variations specific to the equipment. The variations may be caused due to variations in load transient response characteristics relating to the voltage current supply of various devices, such as a power supply unit of the equipment, a power amplifier unit, capacitors constituting the peripheral circuit, and/or the like. Since each of the devices has a temperature characteristic, they may be affected by the surrounding temperature. The transient response characteristics may also vary based on the variation of the input signal level to the power amplifier unit. The variation of the input signal level may be caused due to the variation of transmission traffic and the difference of the number of subcarriers for use of transmission. Therefore, for mass production and operation, it is desirable that the compensation coefficients are adaptively updated and optimized automatically during the operation of the equipment.

The difference of transient response characteristics of RF output may be caused based on one or more of a first factor, a second factor and a third factor. The first factor is a difference of transient response by individual difference of equipment; the second factor is impact of the environmental temperature changing on transient response; and the third factor is impact of the difference of input signal level on transient response. The difference of transient response characteristics based on the first, second and third factors is described below.

Figure 11:
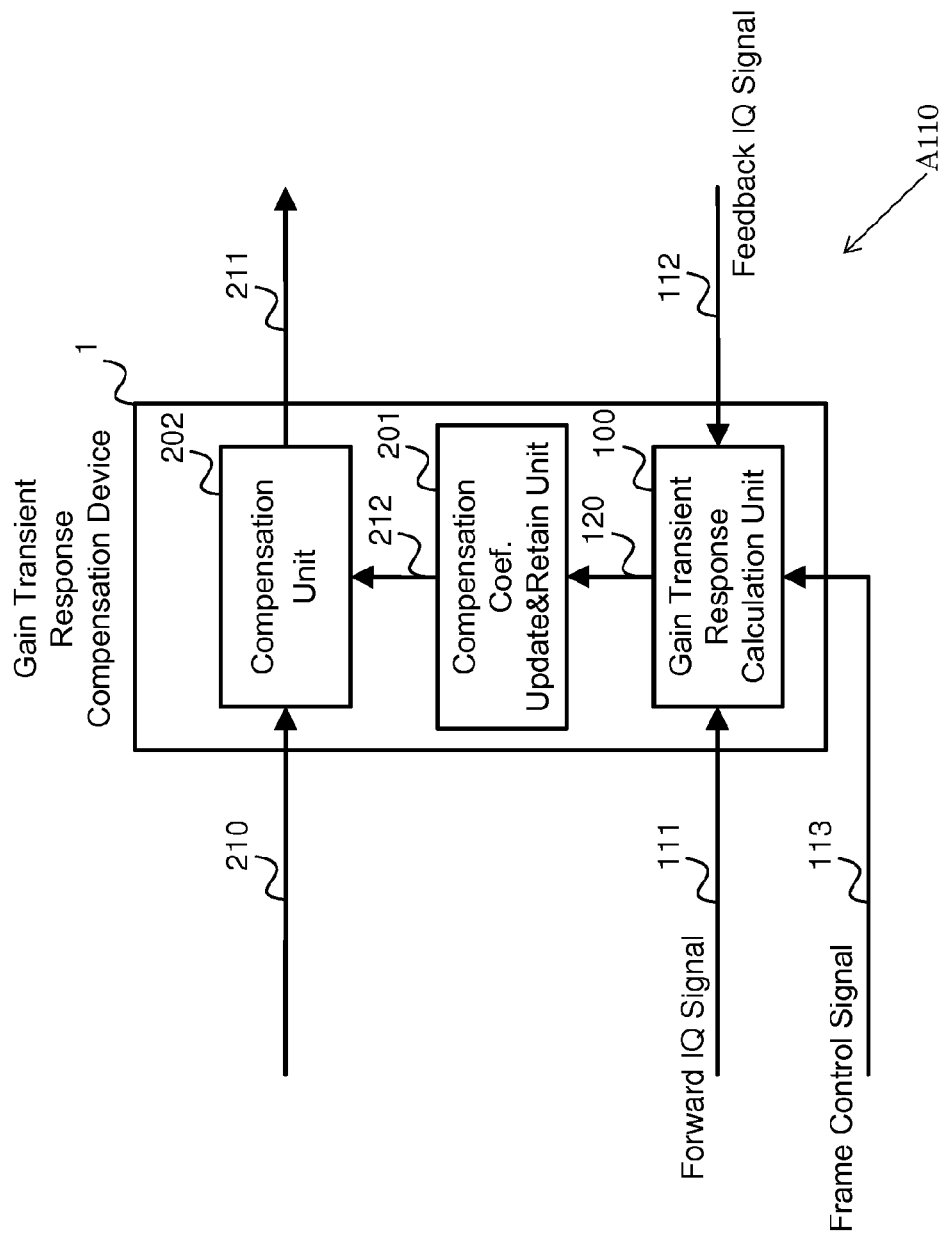
FIG. 11 is a block diagram of a system in accordance with an example embodiment.

FIG. 11 is a block diagram of a system, indicated generally by the reference numeral A110, in accordance with an example embodiment. System A110 illustrates a configuration of a gain transient response compensation (GTC) circuit 1 according to the example embodiment. (The gain transient response compensation circuit 1 is labelled gain Transient Response Compensation Device in FIG. 11—the terms "circuit" and "device" are used interchangeably in this context.)

GTC circuit 1 comprises a gain transient response (GTR) calculation unit 100, a compensation coefficient update and retain unit 201, and a compensation unit 202. The GTR calculation unit 100 calculates compensation coefficient series, which is the inverse characteristic of the relative GTR from forward IQ signal 111 and feedback IQ signal 112. Baseband forward signal 210 (derived from forward IQ signal 111) is the baseband IQ data to be transmitted, and the feedback IQ signal 112 is the output of the power amplifier unit, as described in detail above. The coefficient update-and-retain unit 201 updates the compensation coefficient sequence and stores the updated compensation coefficient series. The compensation unit 202 compensates the baseband forward signal 210 to be transmitted using the retained compensation coefficient sequence. Note that the baseband forward signal 210 is compensated by the compensation coefficient.

Figure 12:
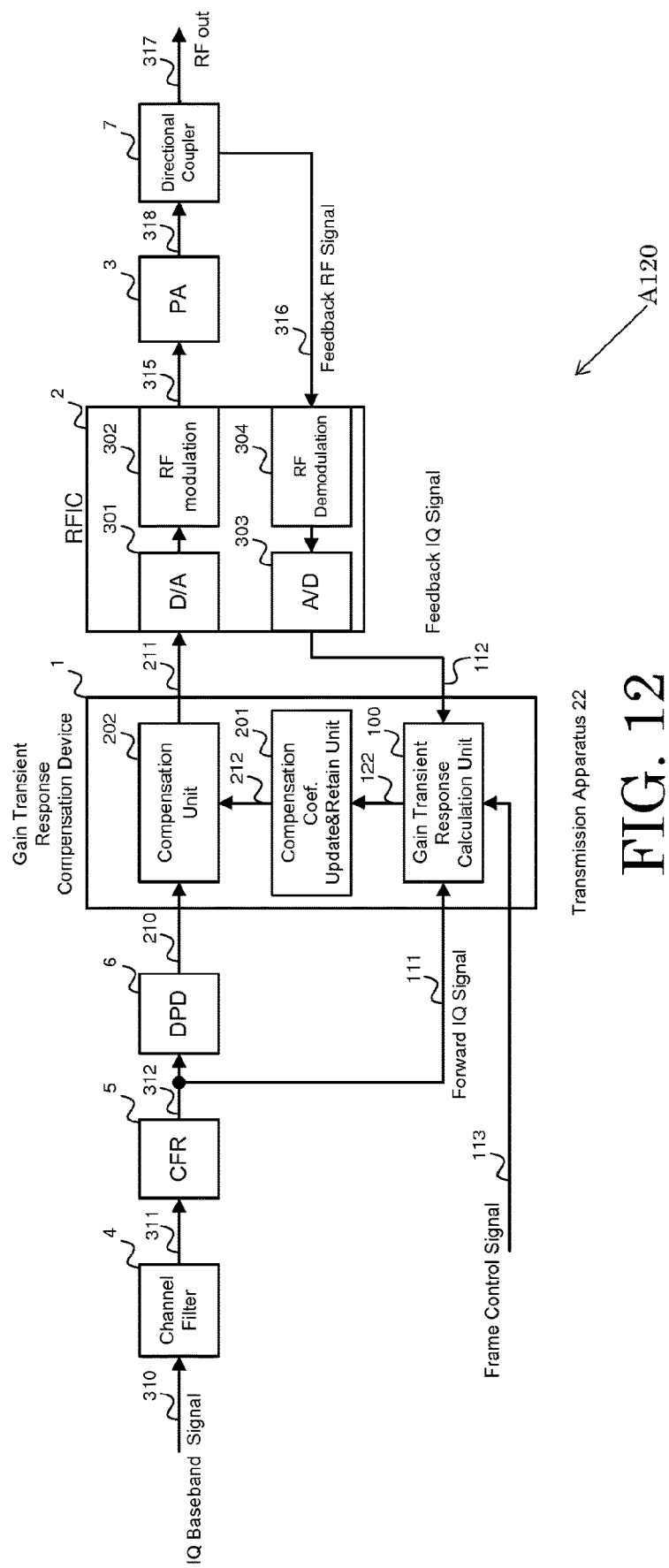
FIG. 12 is a block diagram of a system in accordance with an example embodiment.

FIG. 12 is a block diagram of a system, indicated generally by the reference numeral A120, in accordance with an example embodiment. System A120 illustrates the GTC circuit 1 in operation with other devices involved in the transmission of the signal. System A120 comprises the channel filter unit 4, CFR unit 5 and DPD unit 6 described above, which are provided before the GTC circuit. System A120 further comprises the RFIC unit 2, power amplifier 3 and directional coupler 7 described above, which are provided after the GTC circuit. As described above, RFIC unit 2 converts a baseband IQ signal to an RF signal of desired carrier frequency and converts RF feedback signal from power amplifier 3 to complex baseband signal; power amplifier 3 amplifies the RF signal; and directional coupler 7 gets RF feedback signal from RF output.

The detailed operation of GTC circuit 1 is described below.

Figure 13:
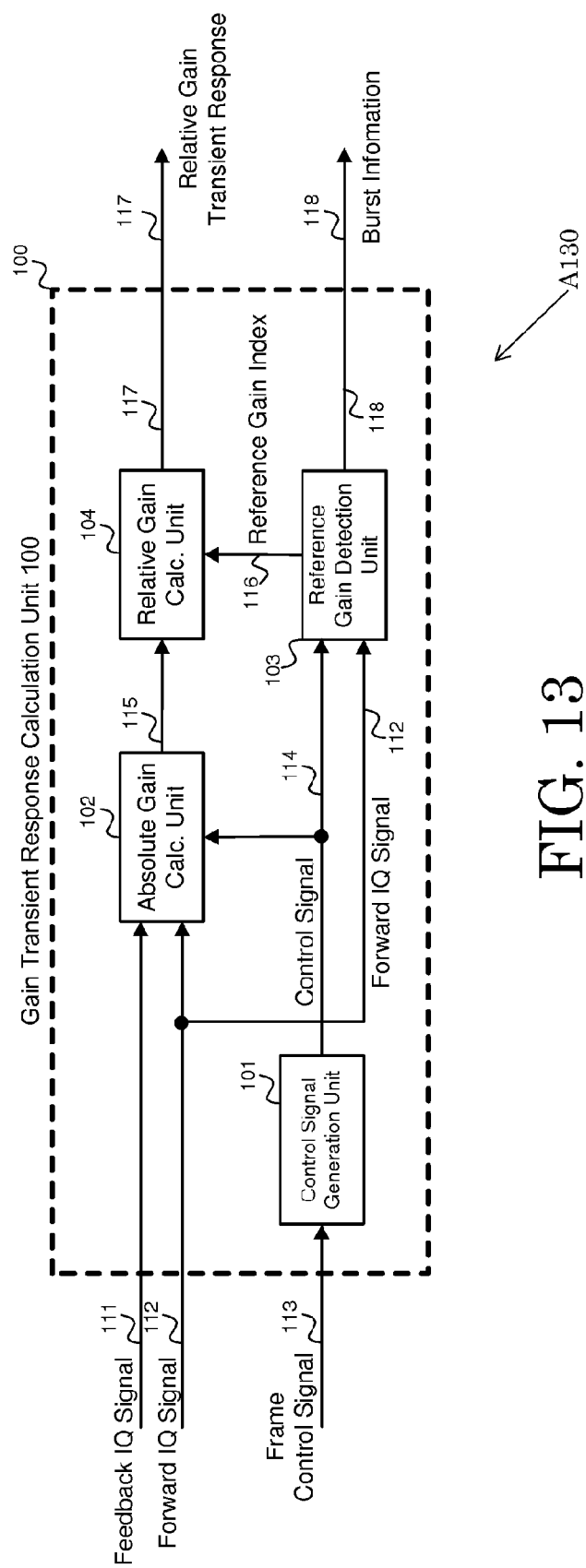
FIG. 13 is a block diagram of a system in accordance with an example embodiment.

FIG. 13 is a block diagram of a system, generally indicated by the reference numeral A130, in accordance with an example embodiment. System A130 illustrates the GTR calculation unit 100, which is comprised within the GTC circuit 1.

The inputs to the GTR calculation unit 100 are the forward IQ signal 112, feedback IQ signal 111 of a burst signal, and frame control signal 113. The frame control signal 113 indicates the time region of time division duplex (TDD) signal. The GTR calculation unit 100 comprises control signal generation unit 101, absolute gain calculation unit 102, reference gain detection unit 103, and relative gain calculation unit 104. The control signal generation unit 101 generates symbol control signal from frame control signal. The absolute gain calculation unit 102 calculates absolute GTR using forward IQ signal and feedback IQ signal. The reference gain detection unit 103 detects reference gain index. The relative gain calculation unit 104 calculates relative GTR with respect to absolute GTR with reference to absolute gain at the time position of reference gain index. The outputs of the GTR calculation unit 100 is a relative GTR 117 in the beginning region of burst signal and burst information 118. The process for generating the relative GTR is detailed below.

Figure 14:
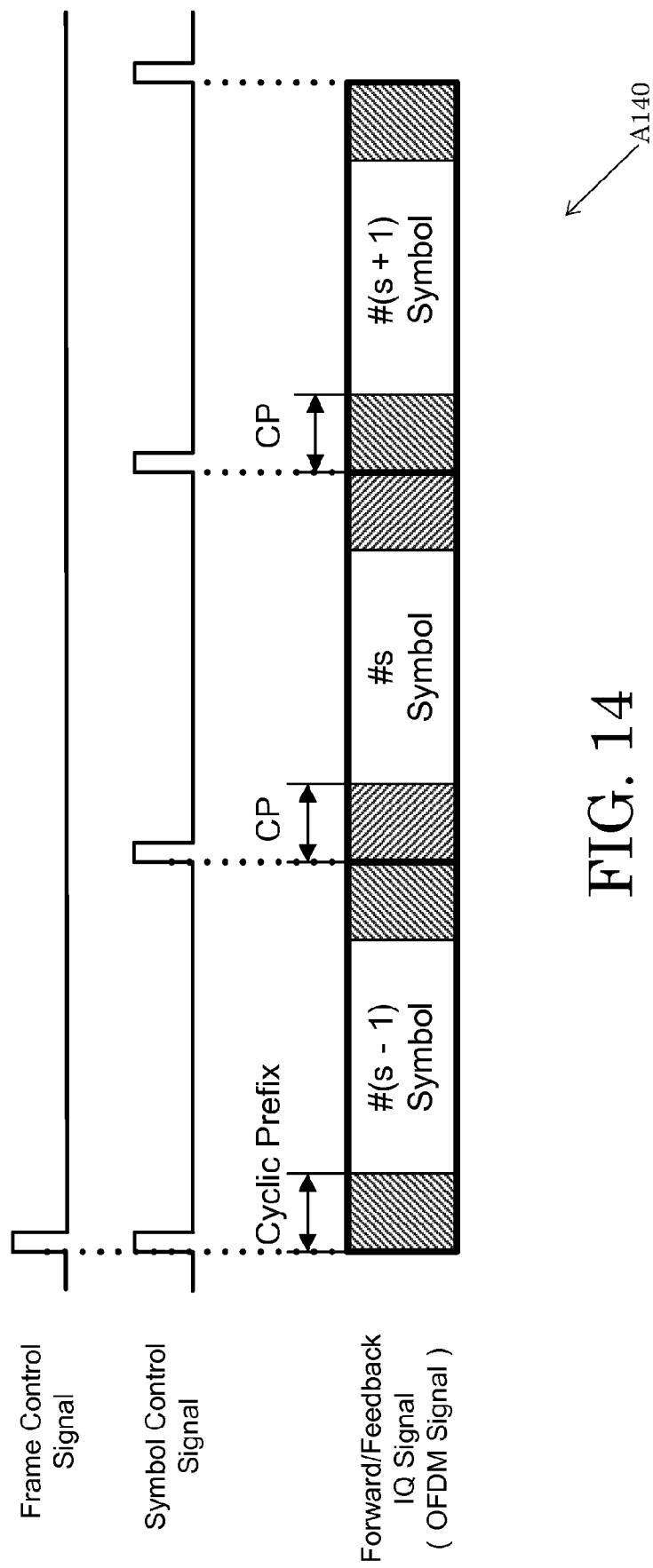
FIG. 14 shows signals generated in accordance with an example embodiment.

FIG. 14 shows signals generated by control signal generation unit 101, indicated generally by the reference numeral A140, in accordance with an example embodiment. Signals A140 include a frame control signal, a symbol control signal generated by control signal generation unit 101, and a corresponding forward and feedback IQ signal.

The symbol control signal generated by the control signal generation unit 101 indicates symbol timing of modulation signal based on frame control signal and signal information. The signal information contains the signal information on signal format, such as modulation parameter of transmit signal, symbol duration, and burst signal duration. A boundary of a symbol may be known from the signal information.

Figure 15:
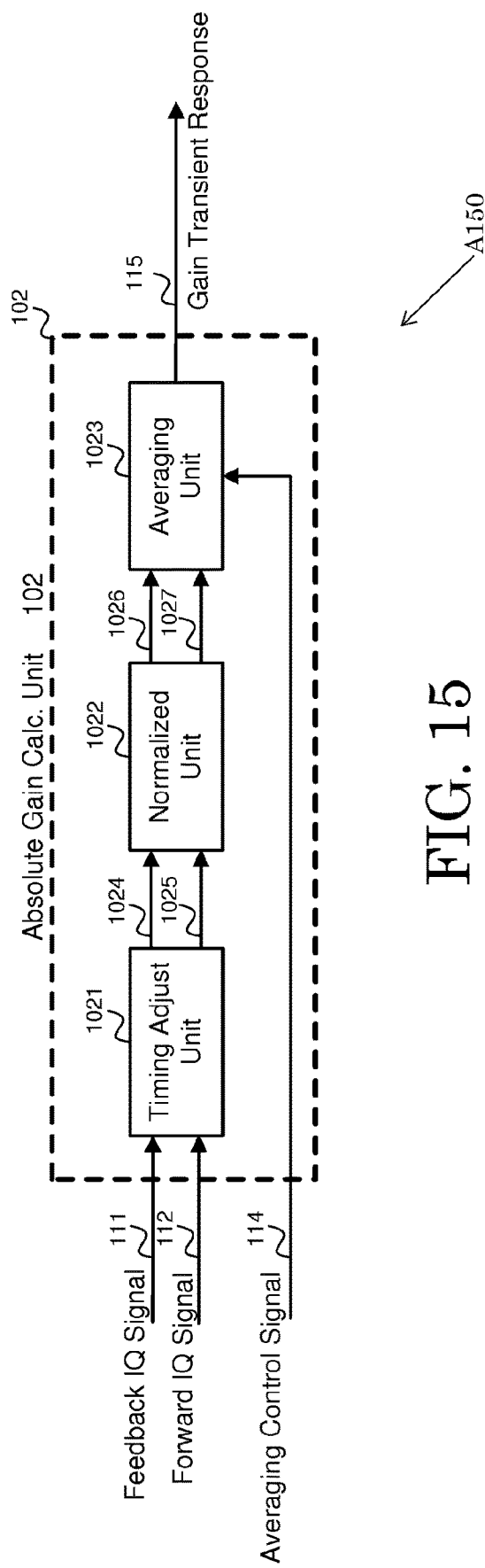
FIG. 15 is a block diagram of a system in accordance with an example embodiment.

FIG. 15 is a block diagram of a system, generally indicated by the reference numeral A150, in accordance with an example embodiment. System A150 illustrates the absolute gain calculation unit 102, which is comprised within the GTC circuit 1. The absolute gain calculation unit 102 calculates gain series of feedback IQ signal with respect to forward IQ signal in each sample. The gain is referred to as "absolute gain" herein.

The absolute gain calculation unit 102 comprises timing adjust unit 1021, normalized unit 1022, and averaging unit 1023. The timing adjust unit 1021 adjusts the sample timing between forward IQ signal and feedback IQ signal. Inputs to the absolute gain calculation unit include feedback IQ signal 111, forward IQ signal 112, and averaging control signal 114. Output from the absolute gain calculation unit 102 is GTR 115. For illustration purpose, M times up-sampling and correlation processing can be used for the timing adjustment processing as example, as shown in the following equations. However, the timing adjustment processing can be performed using any other techniques.

In the following equations E11 and E12, the representation of the sample before up-sampling is denoted as "t", and the representation of the sample after up-sampling is denoted as "m". Nsp is the total number of samples used for compensating the GTR from the beginning of the burst signal.

Before up-sampling: t=1, ..., Nsp
After up-sampling: m=1, ..., Nsp×M

E11:

$$Sb(t) \Rightarrow \text{up-sampling} \times M \Rightarrow Sb(m) \qquad (11)$$

E12:

$$Sf(t) \Rightarrow \text{up-sampling} \times M \Rightarrow Sf(m) \qquad (12)$$

After the up-sampling, the timing between two up-sampled signal Sb(m) and Sf(m) is adjusted with high resolution. Down-sampling by (1/M) times is then performed to restore the original sampling rate again, as shown in the following equations E13 and E14. The timing difference is denoted by Δm, and the down-sampled signals after timing adjustment are denoted by and Sb(i) and Sf(i) (i=1, ..., Nsp).

E13:

$$Sb(m-\Delta m) \Rightarrow \text{Down-sampling} \times (1/M) Sb(i) \qquad (13)$$

E14:

$$Sf(m) \Rightarrow \text{Down-sampling} \times (1/M) \Rightarrow Sf(i) \qquad (14)$$

Sb(i) and Sf(i) may be obtained such that the timing of both Sb(i) and Sf(i) are matched at the same sample position "i". For illustration purposes, the timing adjustment is performed with M=8 as an example.

A division processing, as illustrated in equation E15, is performed to calculate absolute GTR "aG(i)" which shows the gain of feedback IQ signal against forward IQ signal as a reference.

E15:

$$aG(i)=Sb(i)/Sf(i) \quad i=1,\ldots,Nsp \quad (15)$$

The division shown in equation E15 is processed by complex-vector and the process error incurred in the output depends on the amplitude scale of the sample. Therefore, the variation for each sample becomes large for each sample. Therefore, the averaged value with the interval of symbol duration from sample based absolute gain aG(i) is calculated as shown in the following equation E16. The symbol based absolute GTR aG_ave(s) for a predetermined number of symbols Nsym (=15) from the symbol in the beginning is obtained. A target sample index for averaging at the symbol index "s" is denoted by i_sym(s), where i_sym(s) ranges from i_start(s) to i_end(s) (i_itv(u)=i_start(u), i_end(u)). The number of samples for averaging at the symbol index "s" is denoted by Nave(s) (Nave(s)=i_end(s)−i_start(s)+1).

E16:

$$\text{Symbol absolute } GTR: \text{aG\_ave}(s) = \left\{ \sum_{i_{start}(s)}^{i_{end}(s)} aG(i_{sym}(s)) \right\} / Nave(s) \quad (16)$$

Symbol index: s=1,…,Nsym

Figure 16:
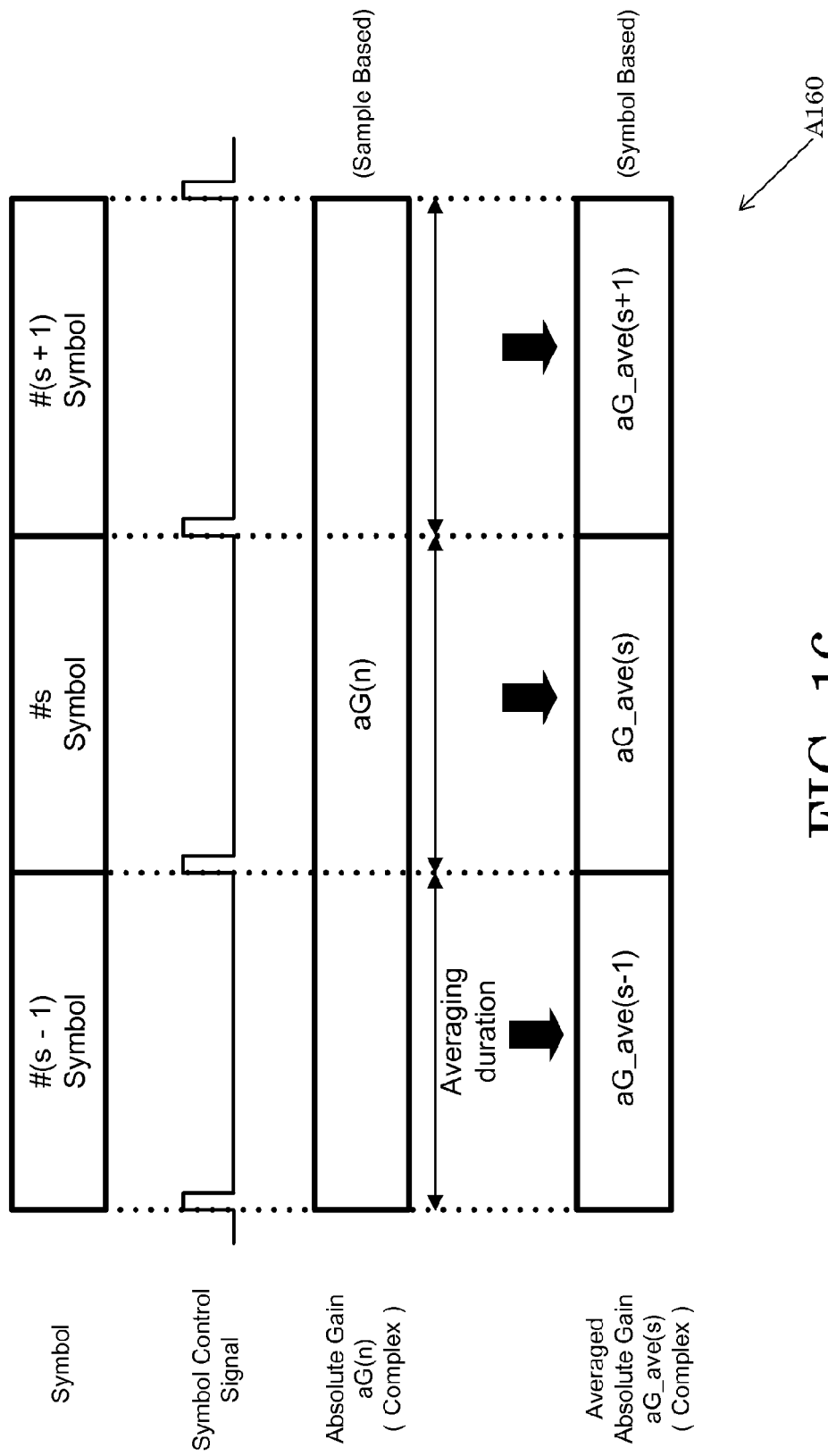
FIG. 16 shows symbols generated in accordance with an example embodiment.

FIG. 16 shows symbols generated, generally indicated by the reference numeral A160, in accordance with an example embodiment. Symbols A160 include symbols before and after averaging absolute gain for each symbol by averaging unit. In the symbol averaging process, the symbol period can be determined by symbol control signal generated in control signal generation unit 101.

At reference gain detection unit 103, control signal 114 and forward IQ signal 112 are received as inputs. A portion to be regarded as a reference gain is detected from symbol absolute gain in the region where the gain is determined to be stable. An output from the reference gain detection unit 103 is a specified reference gain index. Since absolute gain of each symbol is targeted, a reference gain index is a symbol position from the beginning of the burst, and the reference gain index is illustrated to be an integer number starting with 1.

A method for detecting symbol position of a reference gain is described in detail below according to an example embodiment.

In the earlier example embodiments, the power of each symbol in the transmit signal was considered to be the same, and the symbol position, which is assumed to converge, was specified approximately (for example, the fifteenth symbol in FIG. 7). As such, the same symbol position was set as reference gain. However, in an LTE (Long-Term evolution) system, the number of subcarriers activated in a symbol (the number of subcarriers whose amplitude is non-zero) changes according to the traffic. As a result, the symbol power fluctuates in the operated signal according to the amount of the control channel to be transmitted and the traffic volume of the user. As such, a fourth factor that may cause difference of transient response characteristics is an impact of symbol power fluctuating on GTR. Therefore, in the following example embodiments, the influence of symbol power on GTR is shown in addition to a method for determining reference gain.

Figure 17:
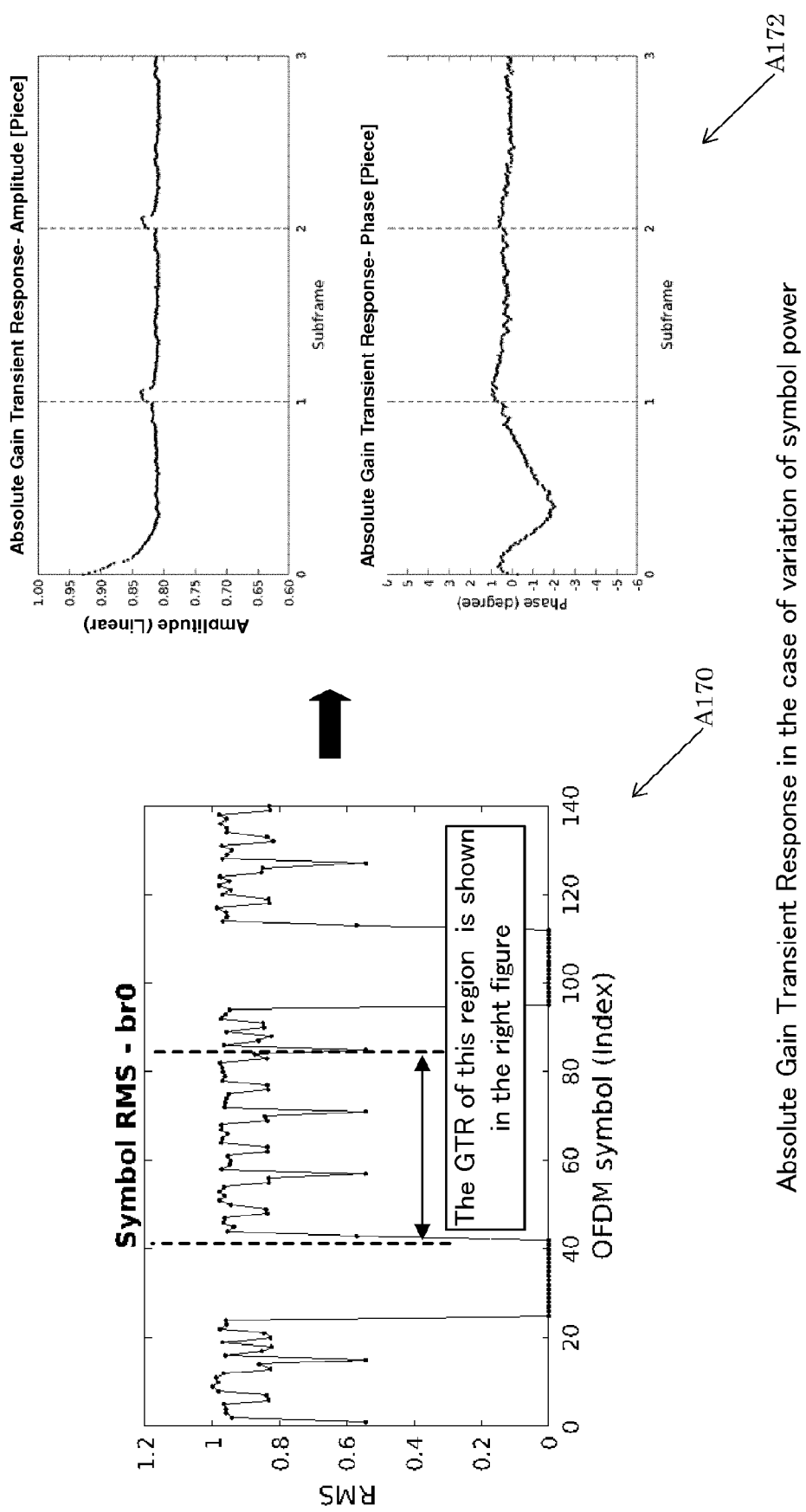
FIG. 17 shows signals generated in accordance with an example embodiment.

FIG. 17 shows signals generated when symbol power fluctuates, generally indicated by the reference numerals A170 and A172, in accordance with an example embodiment. Signals A170 show symbol level with root mean square (RMS) of an input signal. Signals A172 show an absolute GTR when the signal is received as input.

For illustration purposes, the test signal here is a LTE signal with LTE Transmission Mode 9. The symbol power for the first symbol and the fifteenth symbol is smaller than that for the other symbols. In this example, the LTE signal contains a Physical Downlink Control Channel (PDCCH) in the first symbol in each subframe. Any unused subcarrier exists in PDCCH even if the amount of data in a Physical Downlink Shared Channels (PDSCH) is large. In the GTR shown in signals A172, the symbol level (RMS) in the fifteenth symbol is relatively small in comparison with the preceding and succeeding symbol (i.e. the fourteenth symbol and the sixteenth symbol) by about half. Accordingly, the amplitude of the gain in the fifteenth symbol is large by about 0.02. As described above, when the symbol power of the signal input to power amplifier 3 fluctuates significantly, the GTR also changes.

While determining absolute gain of a symbol, if the fluctuation of the symbol power is increasing prior to determining the reference gain, the variation of absolute gain in the symbol is superimposed on relative gain as an offset. As a result, an error is caused in compensation coefficient value to be calculated, and the GTR of the amplifier cannot be accurately compensated. Therefore, as reference gain, it is an advantage to detect the absolute gain in a stable part with relatively same power level avoiding the fluctuation portion even in the convergence region of the transient response. This is addressed in the above example embodiment, where a backward portion is used for calculating relative GTR if there are significant changes in symbol power.

Figure 18:
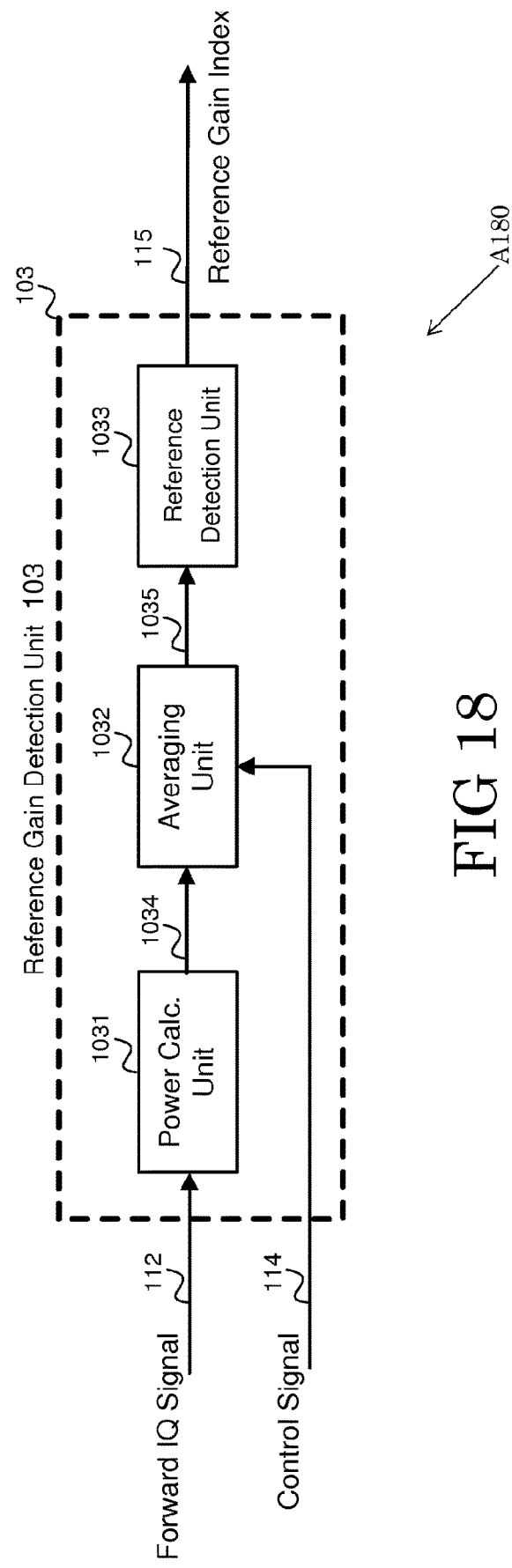
FIG. 18 is a block diagram of a system in accordance with an example embodiment.

FIG. 18 is a block diagram of a system, generally indicated by the reference numeral A180, in accordance with an example embodiment. System A180 illustrates the reference gain detection unit 103 comprised in GTR calculation unit 100.

The reference gain detection unit 103 comprises power calculation unit 1031, averaging unit 1032, and reference detection unit 1033. The power calculation unit 1031 calculates sample power value of forward IQ signal; the averaging unit 1032 calculates symbol power by averaging the sample power in a symbol duration; and the reference detection unit 1033 detects the symbol portion of reference gain from symbol power.

Figure 19:
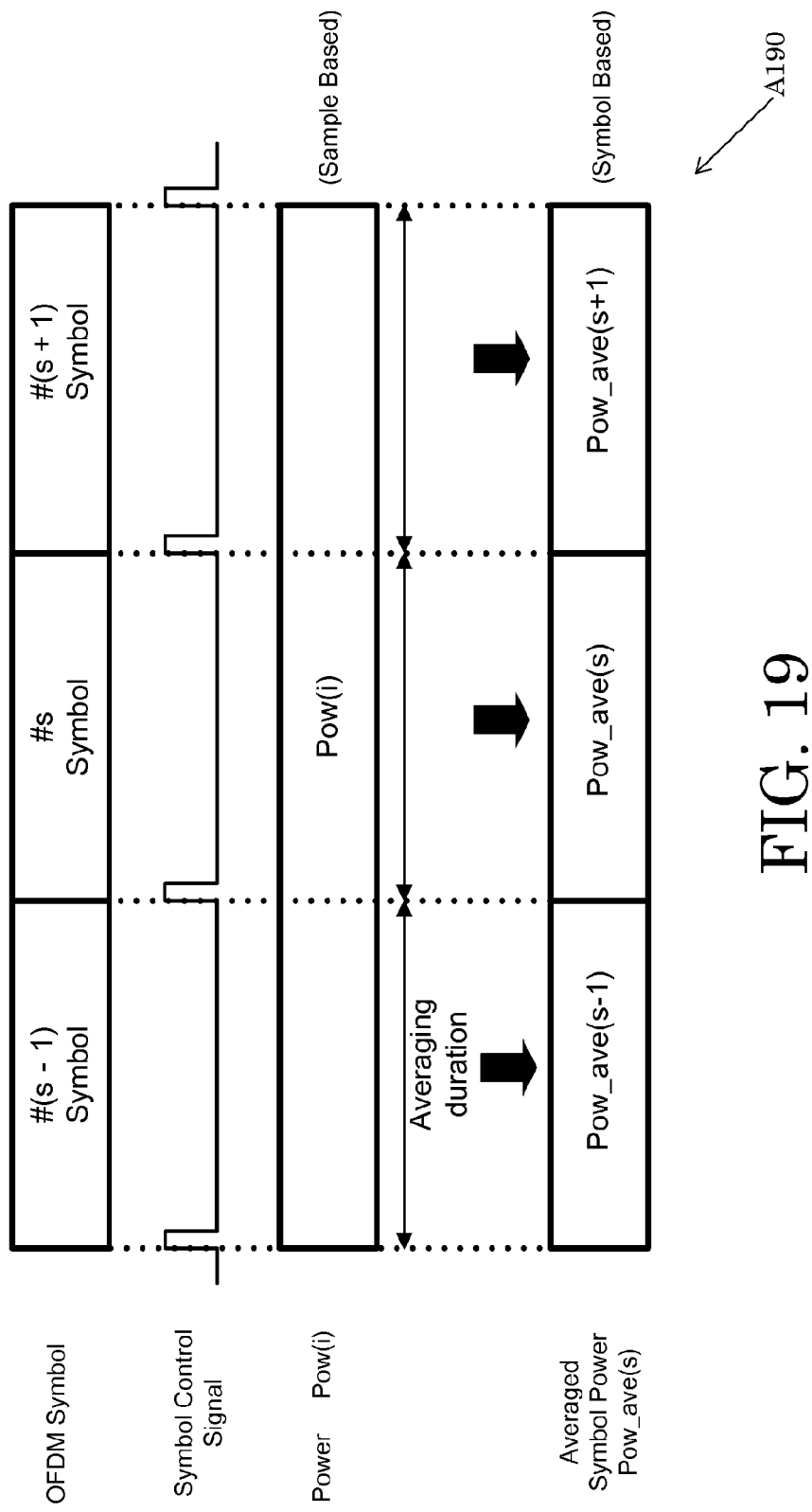
FIG. 19 shows symbols generated in accordance with an example embodiment.

FIG. 19 shows symbols generated, generally indicated by the reference numeral A190, in accordance with an example embodiment. Symbols A190 illustrate calculation of symbol power in the averaging unit 1032. In the averaging unit 1032, symbol power (denoted by Pow_ave(s)) is calculated from sample power (denoted by Pow(i)) based on symbol control unit.

The reference gain detection unit 103 measures a maximum power level in the target detecting duration, and calculates a lower power limit based on the level fluctuation range (denoted by ΔP) from the maximum power level as upper limit.

Figure 20:
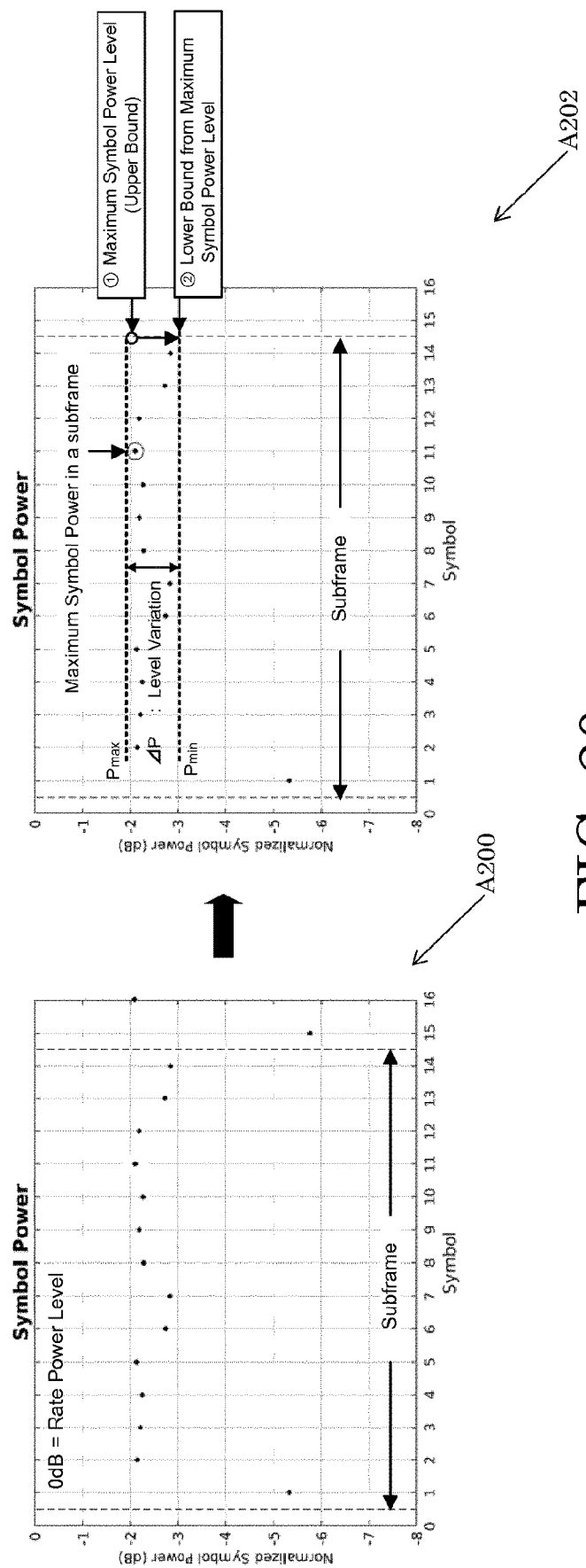
FIG. 20 shows data generated in accordance with an example embodiment.

FIG. 20 shows data generated, generally indicated by the reference numerals A200 and A202, in accordance with an example embodiment. Data A202 illustrates the parameters to detect the symbol position of reference gain from time series of symbol power. Data A200 shows symbol power in chronological order and data A202 shows the parameters for detecting the symbol position of reference gain.

The operation of reference gain detection unit 103 is described in details below. The beginning of a detection interval for detecting reference symbol is denoted by "Sdet_start", and the end of the detection interval is denoted by "Sdet_end".

A maximum power level (denoted by "Pmax") in the detection interval (Sdet_start≤s≤Sdet_end) are measured from time series of symbol power. A minimum power level (denoted by "Pmin") of level fluctuation width (denoted by "ΔP") is calculated from the maximum level Pmax. The level fluctuation width ΔP may be a predetermined value.

A later portion of a stable level region may be specified by firstly counting the number of symbols (denoted by "Nstb") continuing within the range of level fluctuation width ΔP by the predetermined number of symbol Nstb, and then by specifying the symbol position in which the count value continuously exceeds the predetermined number Ndet. The symbol position of reference gain is denoted by s_ref.

The below algorithm illustrates a procedure for detecting a reference symbol. For illustration purposes, the following MATLAB M-file code is presented:

Here, ΔP is denoted by deltaP in the following code.

```
% Parameter Configuration
Nstb = 4;
PowCount_ref = 6;
Sdet_start = 1;
Sdet_end = 16;
deltaP = 1.0;
% Initialize
s_ref_temp = [ ]; % empty
s_ref = [ ]; % empty
% Detection of Reference Symbol Index
Pmax = max( Pow(Sdet_start:Sdet_end) );
for s=Sdet_start:Sdet_end
if s >= Sdet_start+Nstb-1
PowDiff(s) = min( Pow( s-Nstb+1:s ) ) - Pmax;
PowDet(s) = PowDiff(s) >= -deltaP;
if PowDet(s) == 1
PowCount(s) = PowCount(s-1) + 1;
elseif PowDet(s) == 0
PowCount(s) = 0;
end
if PowCount(s) >= PowCount_ref
s_ref_temp = [ s_ref_temp s];
end
else
PowDiff(s) = 0.0;
PowDet(s) = 0;
PowCount(s) = 0;
end
end
s_ref = max( s_ref_temp );
if isempty(s_ref)
    Flag_Detected = 0;
else
    Flag_Detected = 1;
end
```

In the code above:

The value of PowDiff(s) is showed with marker 'o' in FIG. 21(*b*).

The value of PowDet(s) is showed with marker 'o' in FIG. 21(*c*).

The value of PowCount(s) is showed with marker 'x' in FIG. 21(*c*).

We can find the validation of the detection process by 'Flag_Detected'.

If the process is invalid, that is 'Flag_Detected=0', the current update process may be skipped to the next signal capture timing.

At operation [B1], a fluctuation interval width of symbol power (denoted by "PowDiff(s)") within the number of level stable symbols Nstb is calculated. The symbol at "s" where "PwdDiff(s)" is within the predetermined range ΔP is regarded as valid, and PowDet(s) is set to be one. The "PowDet(s)" is cumulatively counted. If the "PwdDiff(s)" for a symbol at is out of range of ΔP, the symbol at "s" is regarded as invalid and PowDet(s) is set to zero. The accumulate count value is referred to as symbol power continuous value (denoted by "PowCont(s)").

Then, the symbol position having symbol power continuous value equal to or larger than the predetermined value "PowCont_ref" is regarded as a reference symbol candidate, and a last one of several reference symbol candidates in the detection interval is set as reference symbol.

Interval Power fluctuation width:
$$\text{PowDiff}(s) = \max\{\text{Pow}(n)\} - \min\{\text{Pow}(n)\} \, n = s - Nstb, \ldots, s$$

Symbol detection value: PowDet(s)=0 if
PowDiff(s)>ΔP

=1 if PowDiff(s)≤ΔP

Symbol power continuous value: PowCont(s)=PowCont(s−1)+PowDet(s) if PowDet(s)=1

=0 if PowDiff(s)=0

Reference symbol index: s_ref=max{s_ref temp} s_ref temp∈argment(PowCont(s)>=PowCont_ref)

Figure 21A:
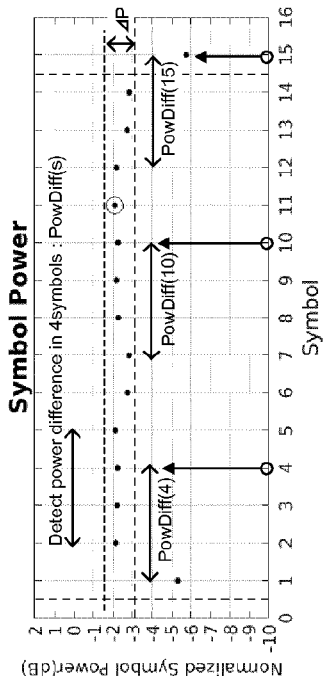
FIGS. 21a, 21b, 21c show data generated in accordance with an example embodiment.
Figure 21B:
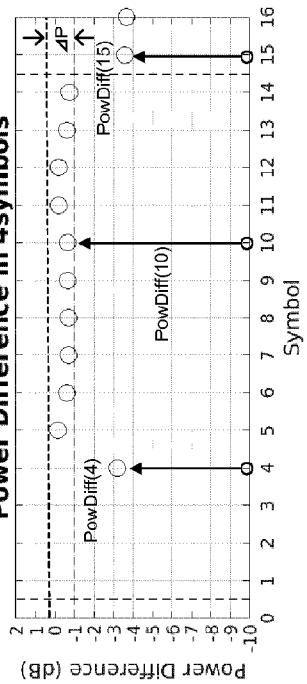
Figure 21C:
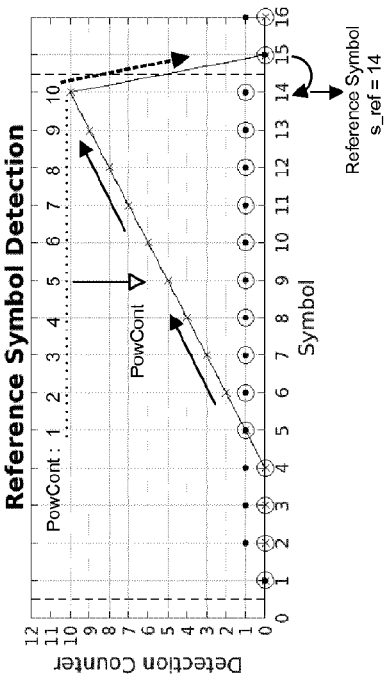

FIGS. 21*a* to 21*c* shows data generated, generally indicated by the reference numeral A210, in accordance with an example embodiment. Data A210 illustrates reference gain detection in a numerical example. The specific values shown in data A210 is for illustration purpose only. ΔP is set to one (deltaP=1.0). Sdet_start is set to two (Sdet_start=1) and Sdet_end is set to fifteen (Sdet_end=16) for detection interval. Nstb is set to four (Nstb=4), and PowCont_ref is set to six (PowCont_ref=6). The position of reference symbol "s_ref" is calculated to be fourteen in this example.

Figure 22:
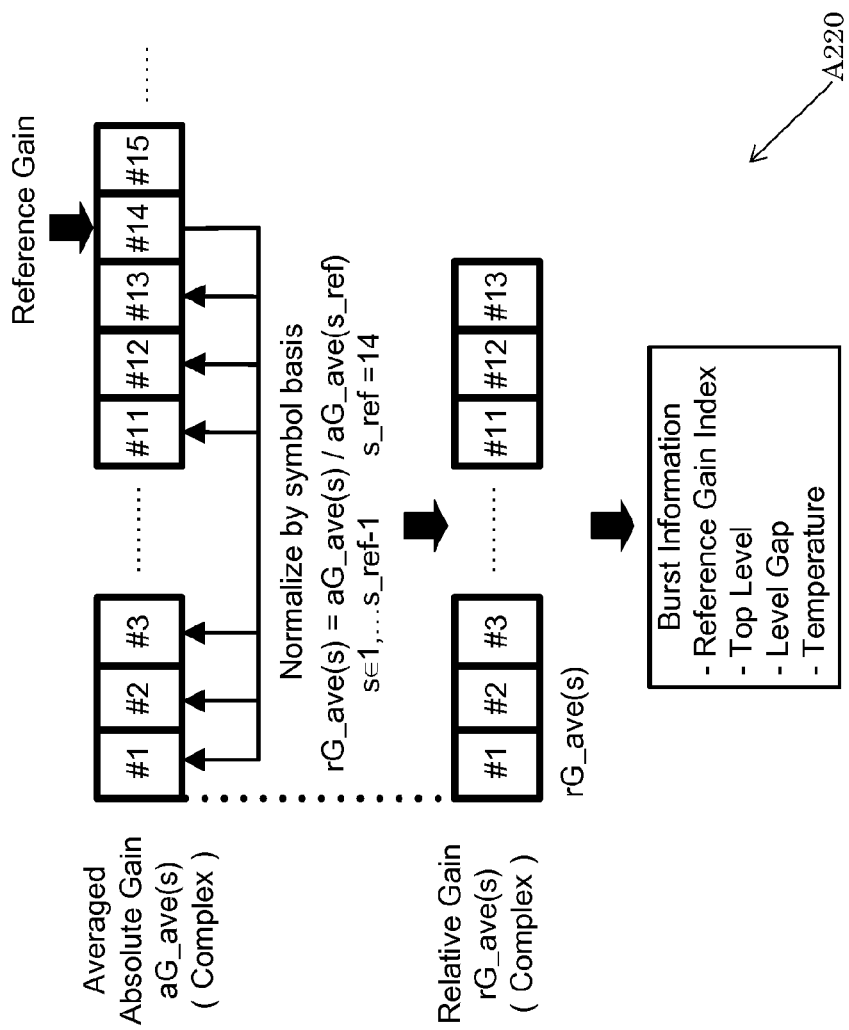
FIGS. 22 to 26 are block diagrams of systems in accordance with example embodiments.

FIG. 22 is a block diagram of a system, generally indicated by the reference numeral A220, in accordance with an example embodiment. System A220 shows the procedure of calculating relative gain at the relative gain calculation unit 104. In the relative gain calculation unit 104, the symbol absolute gain transient from the start symbol to the symbol before the reference symbol are normalized based on the division in the following equation E110. The absolute gain is denoted by aG_ave(s_ref), where s_ref is the reference symbol. As shown in FIG. 21, the fourteenth symbol (s_ref=14) may be considered to be reference symbol. A symbol based relative GTR (denoted by "rG_ave(s)") is calculated with the gain relative to detected reference gain.

E110:

Symbol basis relative GTR: rG_ave(s)=aG_ave(s)/aG_ave(s_ref)

s=1, . . . ,s_ref        (110)

Accordingly, the calculated relative GTR 117 (rG_ave(s)) is sent as output from the GTR calculation unit 100, and is received at the compensation coefficients update and retain unit 201 comprised within the GTR compensation device 1.

This is the next stage of complex gain series in a "(P) th" update processing. New compensation coefficient series ((p) th coefficients) may be calculated using the calculated relative gain and a retained compensation coefficient series ((p−1) th coefficients).

Figure 23:
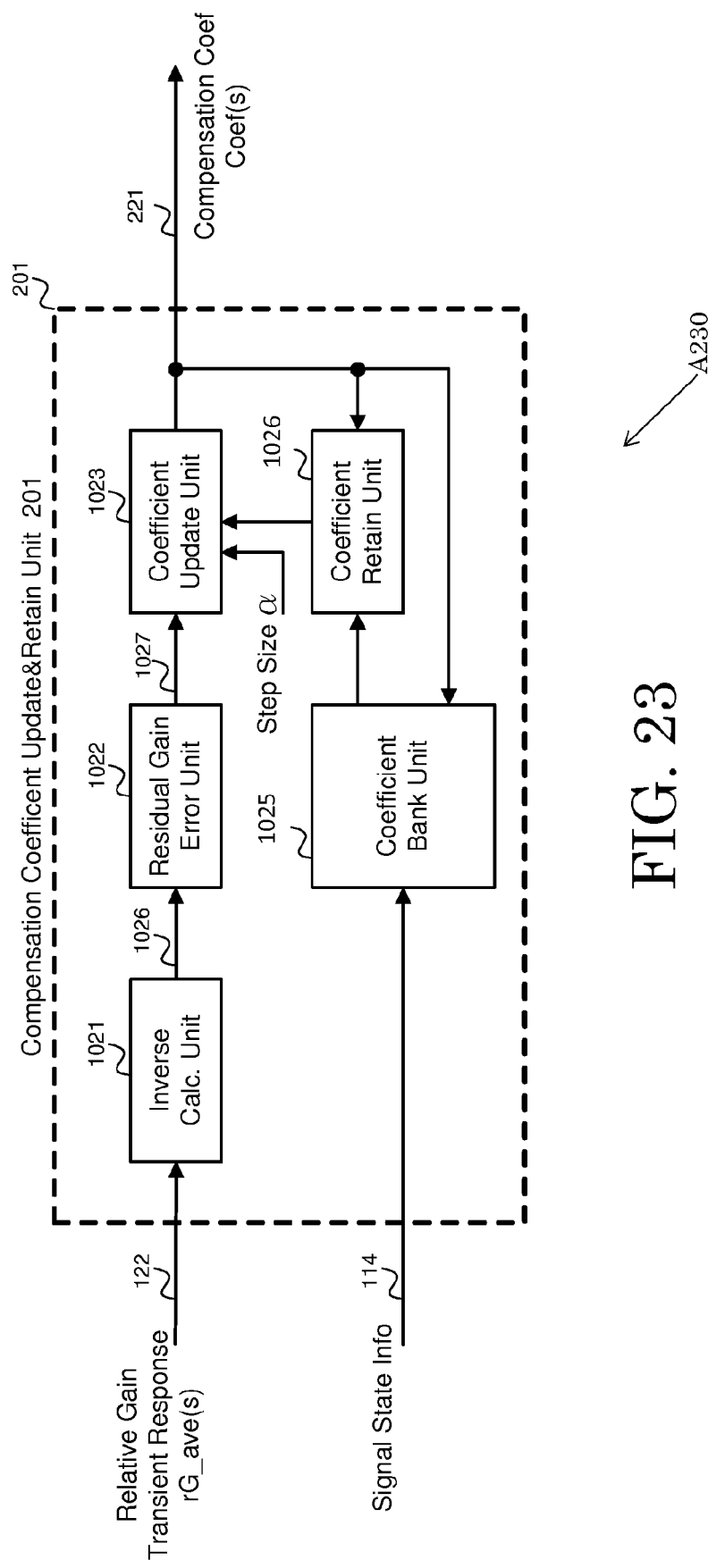

FIG. 23 is a block diagram of a system, generally indicated by the reference numeral A230, in accordance with example embodiments. System A230 illustrates the compensation coefficient update and retain unit 201 comprised in GTR calculation unit 100.

The compensation coefficient update and retain unit 201 comprises an inverse gain calculation unit 1021, a residual gain error unit 1022, a coefficient update unit 1023, a coefficient bank unit 1025, and a coefficient retain unit 1026. The inverse gain calculation unit 1021 calculates the inverse characteristics of the relative GTR; compensation coefficient bank 1025 retains compensation coefficient related to input level and temperature; the residual gain error calculation unit 1022 calculates residual gain error "dG"; and the coefficient update unit 1023 combines the holding compensation coefficient updated in previous time and the output of multiplications residual gain error "dG" by step size "a".

In the inverse gain calculation unit, the inverse characteristics "iG_ave" of relative GTR "rG_ave" is calculated according to the following equation E111.

E111:

$$iG(s)=1/rG\_ave(s)\ s=1,\ldots,s\_ref \tag{111}$$

Through the "iG(s)" is inverse characteristics of relative GTR, we call the "iG(s)", here in update processing, as residual gain coefficient because the "iG(s)" stand by the residual gain measured after being compensated by compensation coefficient being used. The relative GTR as shown in FIG. 8 shows the output wherein the IQ baseband signal is compensated by a GTC value. Thereby, the relative GTR approaches (but does not quite become) [1,0], wherein the error in the relative gain is still in the GTR. We may call that as the residual relative gain (or 'residual gain') in the updating process. We can distinguished the gain status we look into if the GTC value is used or not for compensation by using the word 'residual gain' and 'relative/absolute gain'.

In the update processing of compensation coefficient, the reference symbol position for each burst differs according to the amount of traffic. Therefore, the updating is needed as there may be significant difference of the coefficient length every time the compensation coefficients are updated.

More specifically, compensation coefficients is updated using holding compensation coefficient "Coef(s, p−1)" and gain error. The holding compensation coefficient is calculated in previous update of (P−1)th coefficient. The gain error which contains residual gain compensation coefficient (here, equivalent to inverse characteristics rG_inv(s)). The compensation coefficient series should be updated periodically with a predefined time period.

With update period length shorter length either the length of previous "P−1"th compensation coefficient or residual gain coefficient length "s_ref" in the current "P"th update, then the coefficients being out of common update period is combined to it. Thus, the compensation coefficient series should be updated within 'common update period length' which is determined by shorter length used of either the length of previous "P−1"th compensation coefficient, or residual gain coefficient length "s_ref" in the current "P"th update, then the coefficients being out of common update period is combined to it.

The updating of compensation coefficients based on the difference in compensation coefficient series is illustrated in further details in the examples below.

The reference symbol index with respect to previous updating (P−1)th and current updating (P) th are denoted by "s_ref_pre" and "s_ref", respectively. And the last symbol index of common update period is "s_com". An angle of a complex value "x" is represented by "angle(x)".

Figure 24:
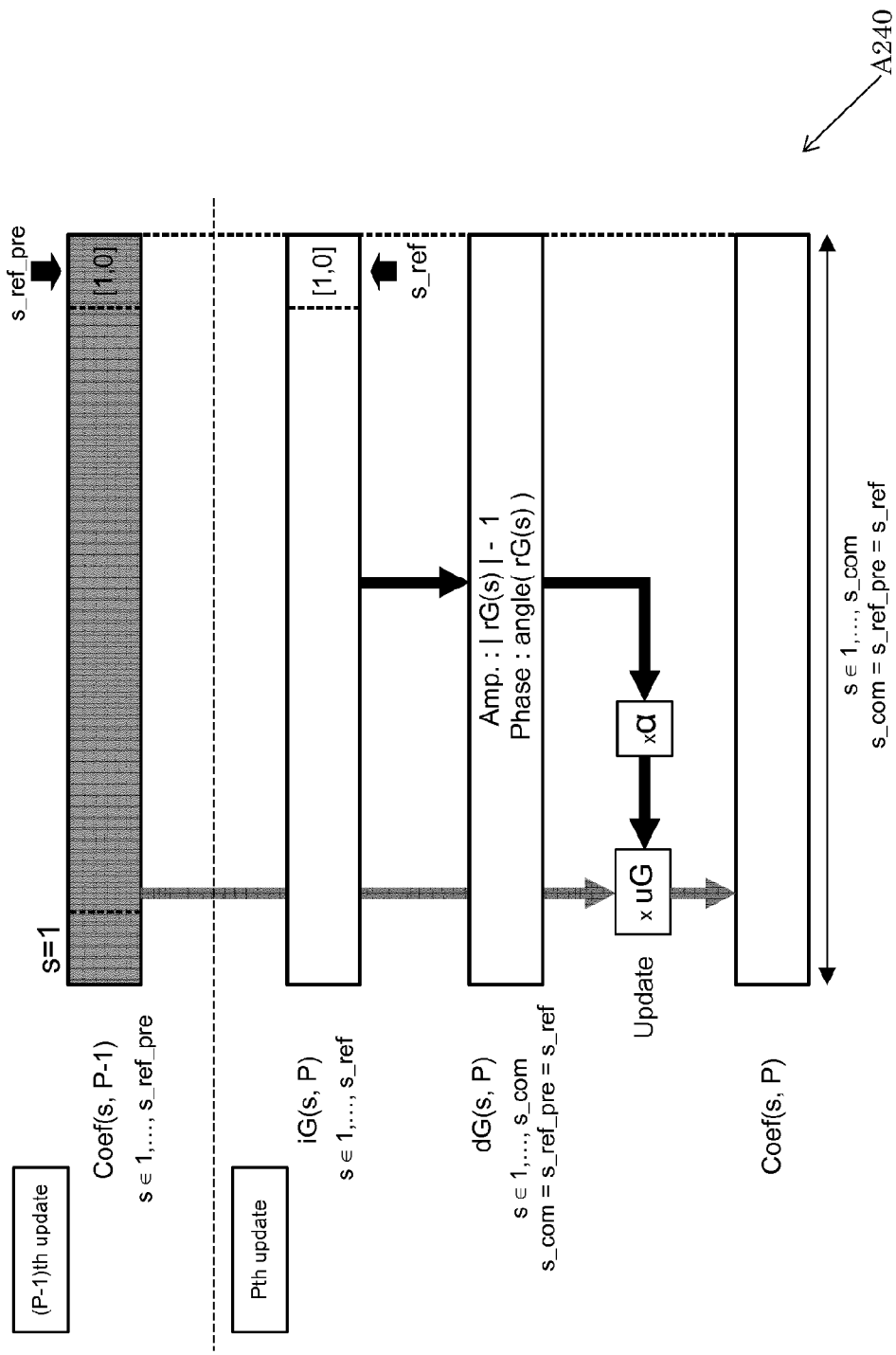

In a first example, the length between previous compensation coefficients is the same as the length between residual gain coefficients. FIG. 24 is a block diagram of a system, generally indicated by the reference numeral A240, in accordance with an example embodiment. System A240 illustrates the relationship of the symbol index between coefficient length before updating the compensation coefficient, coefficient length after updating the compensation coefficient, and the reference symbol. In this example, a common update period is the same length before and after updating, as shown below in equation E112. Therefore, the compensation coefficients are updated as follows without taking the common update period into consideration.

E112:

$$s\_com=s\_ref=s\_ref\_pre \tag{112}$$

Firstly, residual gain error (denoted by "dG(s)") is calculated. For the purpose of compensating both amplitude component and phase component of the residual gain, error of residual gain is extracted as an error vector, as shown below in equation E113 with vector manner expressed in equation (13). However, the error in such an error vector doesn't lead to proportional compensation to "update coefficient cc", that is, "step size", in both amplitude component and phase component.

E113:

$$\text{Error Vector: } dG(s)=iG(s)-1 \tag{113}$$

Accordingly, the amplitude component and phase component is calculating individually as shown below in equation E114. Each of the amplitude component and the phase component is then multiplied with the update coefficient α.

E114:

Amplitude factor of residual gain error:
$dG(s)\_amp=|iG(s)|-1$

Phase factor of residual gain error: $dG(s)\_pha=\text{angle}(iG(s))$ $$s=1,\ldots,s\_ref \tag{114}$$

The update coefficient may be provided for each of amplitude component (denoted by $\alpha_{amp}$) and phase component (denoted by $\alpha_{amp}$), and multiplied to each residual gain error shown below in equation E115. A value of one is added to the amplitude component for update gain (denoted by "uG_amp(s)").

E115:

Amplitude factor of update gain: $uG\_amp(s)=1+dG\_amp(s)*\alpha_{amp}$

Phase factor of update gain: $uG\_pha(s)=dG\_pha(s)*\alpha_{pha}$ $$s=1,\ldots,s\_ref \tag{115}$$

Accordingly, update gain "uG(s, p)" indicating the gain difference to be updated is provided in order to update compensation coefficients in both amplitude component and phase component simultaneously by performing complex multiplication. The update gain uG(s,p) based on update coefficient $\alpha_{amp}$, $\alpha_{pha}$ is shown below in equation E116.

E116:

$$uG(s,p)=uG\_amp(s)*\exp(j*uG\_pha(s))\, s=1,\ldots,s\_ref \quad (116)$$

As described above, the compensation amount can be controlled by multiplying update coefficient $\alpha_{amp}$, $\alpha_{pha}$ with both amplitude component and phase component, independently. Introducing update coefficient provides stable control of compensation coefficient under slight fluctuation of GTR for each burst incurred by traffic variation. Additionally, the gain volume of both amplitude component and phase component of compensation coefficient series can be updated by multiplying update gain "uG(s)" to previous compensation coefficient series "Coef(s, p−1)". Thus, the compensation coefficients series in (P)th update is obtained using the equation E117 shown below.

E117:

$$Coef(s,p)=Coef(s,p-1)*uG(s)\, s=1,\ldots,s\_ref \quad (117)$$

Figure 25:
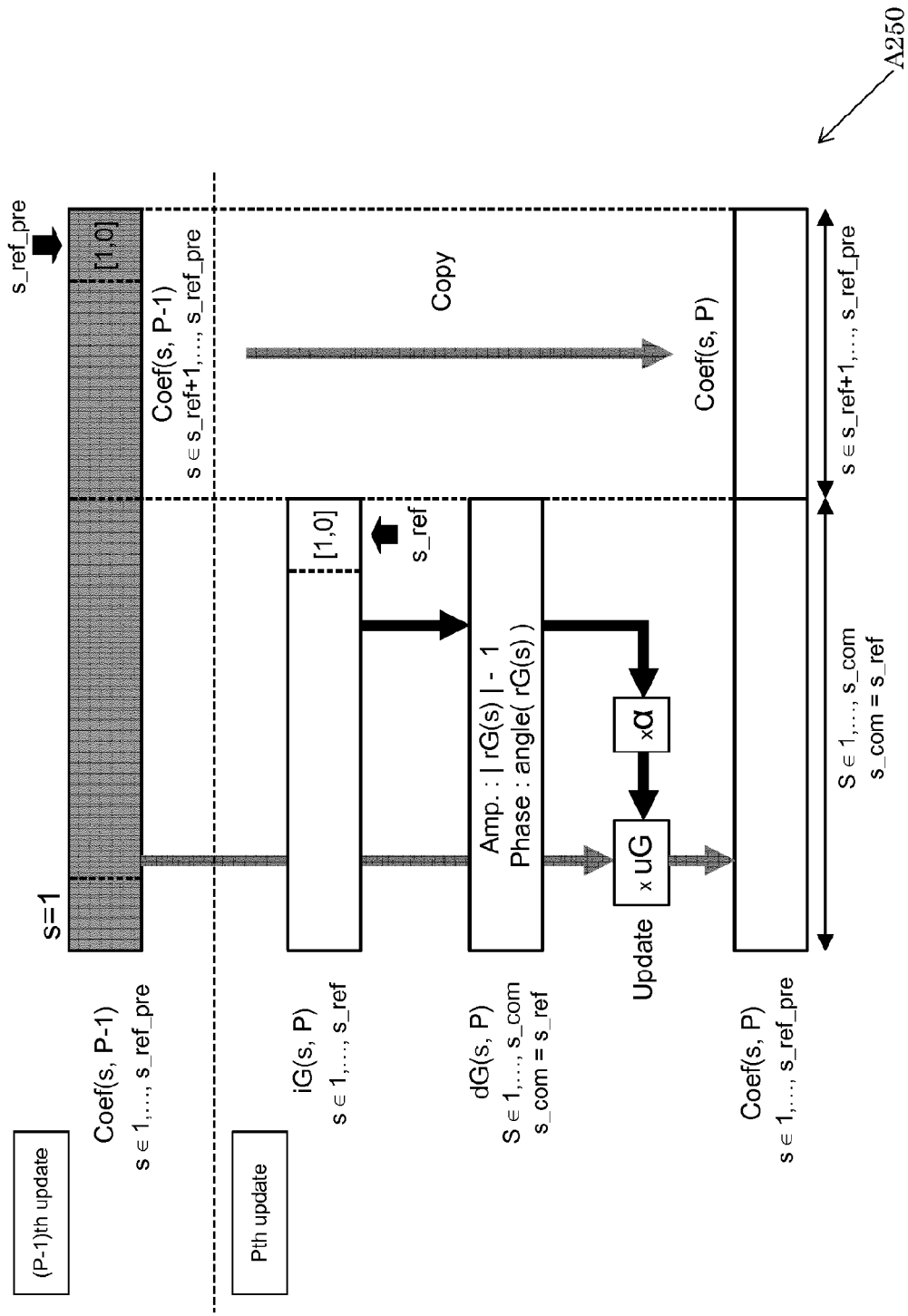

In a second example, the length of residual gain coefficients in a current update is "shorter" than the length of residual gain coefficients of previous compensation coefficients. FIG. 25 is a block diagram of a system, generally indicated by the reference numeral A250, in accordance with an example embodiment. System A250 illustrates the relationship between coefficient length before updating the compensation coefficient, coefficient length after updating the compensation coefficient, and the reference symbol. In this example, the following equation E118 illustrates the relationship of the symbol index between the reference symbol of previous compensation coefficient, residual gain coefficient, and common update period. As such the s_ref is lower than s_ref_pre, and s_com is equal to s_ref.

E118:

$$s\_ref<s\_ref\_pre,\ s\_com=s\_ref \quad (118)$$

As s_com is equal to s_ref, the residual gain error (denoted by dG) of common update period is calculated using the following equation E119. The residual gain error is referenced by complex value [1, 0], that is, reference symbol value of s_ref, and compensation coefficient thereof is calculated by equation 120 referenced by the same complex value [1, 0]. Then, the previous compensation coefficients of outer index of common update period are concatenated to the updated coefficients as shown in equation 121.

E119:

Amplitude factor of residual gain error: $dG(s)\_amp=|iG(s)|-1$

Phase factor of residual gain error: $dG(s)\_pha=\mathrm{angle}(iG(s))$ $$s=1,\ldots,s\_ref \quad (119)$$

E120:

Amplitude factor of update gain: $uG\_amp(s)=1+dG\_amp(s)*\alpha_{amp}$

Phase factor of update gain: $uG\_pha(s)=dG\_pha(s)*\alpha_{pha}$ $$s=1,\ldots,s\_ref \quad (120)$$

E 121:

$$Coef(s,p) = \begin{cases} Coef(s,p-1)*uG(s) & s=1,\ldots,s\_ref \\ Coef(s,p-1) & s=s\_ref+1,\ldots,s_{ref\_pre} \end{cases} \quad (121)$$

Figure 26:
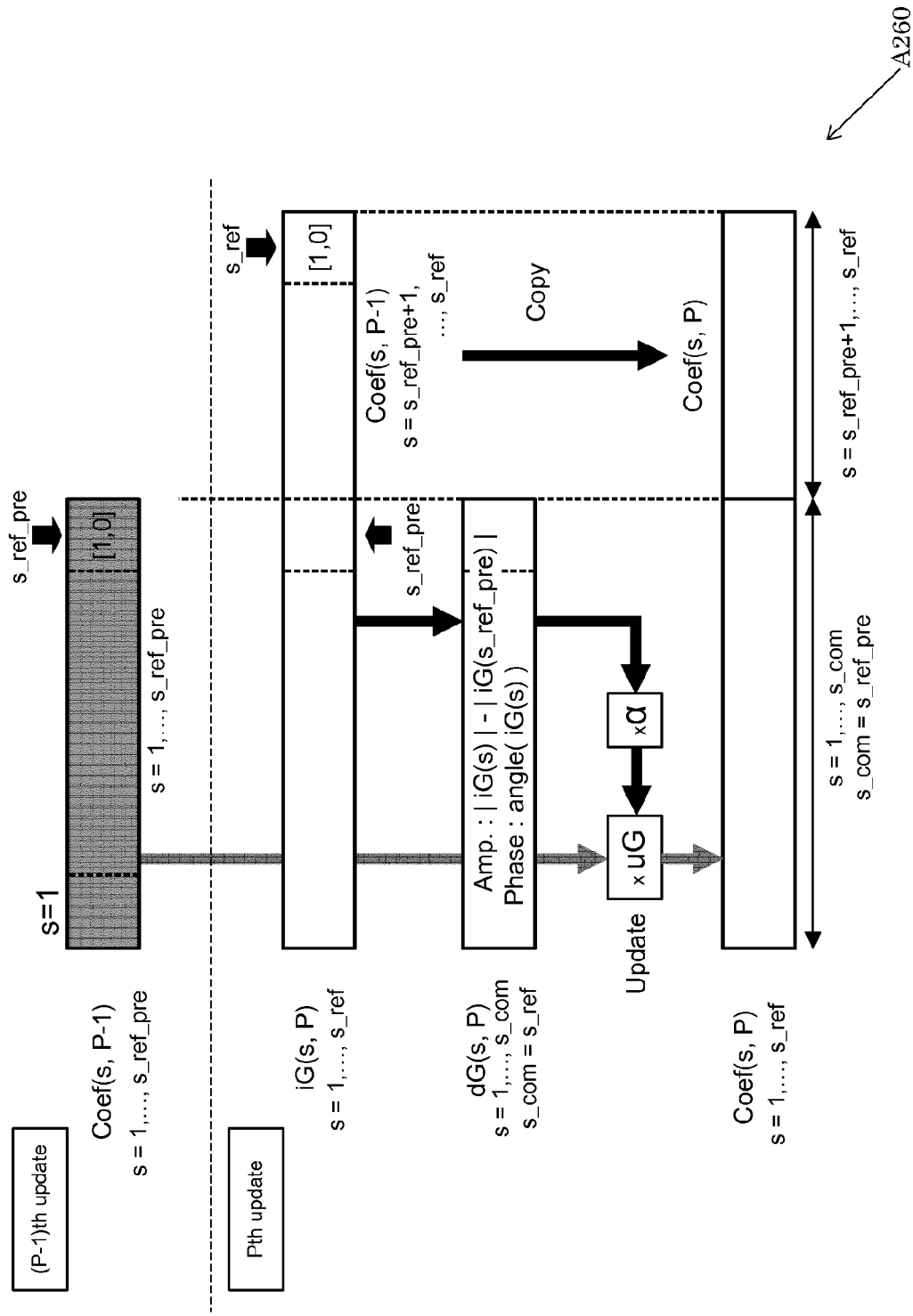

In a third example, the length between previous compensation coefficients is shorter than the length between residual gain coefficients in a current update. FIG. 26 is a block diagram of a system, generally indicated by the reference numeral A260, in accordance with an example embodiment. System A260 illustrates the relationship between coefficient length before updating the compensation coefficient, coefficient length after updating the compensation coefficient, and the reference symbol. In this example, the following equation E122 illustrates the relationship of the symbol index between the reference symbol of previous compensation coefficient, residual gain coefficient, and common update period. As such the s_ref is higher than s_ref_pre, and s_com is equal to s_ref.

E122:

$$s\_ref>s\_ref\_pre,\ s\_com=s\_ref\_pre \quad (122)$$

As s_com is equal to s_ref, the residual gain error (denoted by dG) of common update period is calculated using the following equation E123. The residual gain error is referenced by residual gain coefficient value "iG(s_ref_pre)", that is, reference symbol position "s_ref_pre" of previous coefficient. This is different from the second example, where the residual grain error is referenced by complex value [1,0] at the reference symbol position of residual gain.

E123:

Amplitude factor of residual gain error:
$dG(s)\_amp=|iG(s)|-|iG(s\_ref\_pre)|$

Phase factor of residual gain error: $dG(s)\_pha=\mathrm{angle}(iG(s))-\mathrm{angle}(iG(s\_ref\_pre))$ $$s=1,\ldots,s\_ref\_pre \quad (123)$$

Additionally, the compensation coefficient is calculated using equation E124 shown below. The compensation coefficient is referenced by the same residual gain coefficient value "iG(s_ref_pre)" located in the reference symbol position "s_ref_pre" of previous coefficients.

E124:

Amplitude factor of update gain: $uG\_amp(s)=\mathrm{abs}(iG(s\_ref\_pre))*(1+dG\_amp(s)*\alpha)$ Phase factor of update gain: $uG\_pha(s)=\mathrm{angle}(iG(s\_ref\_pre))+dG\_pha(s)*\alpha$ $$s\in 1,\ldots,s\_ref\_pre \quad (124)$$

The residual gain coefficients for the outer index of common update period in (p)th update are concatenated as the updated coefficients period as shown below in equation E125.

E 125:

$$Coef(s,p) = \begin{cases} Coef(s,p-1)*uG(s) & s=1,\ldots,s\_ref\_pre \\ iG(s) & s=(s\_ref\_pre+1),\ldots,s_{ref} \end{cases} \quad (125)$$

In the above examples, namely the first, second and third examples, the equations can be compared. Equations E115 and E119 can be expressed as the following equation E122, as the residual gain at "s_ref" in the first and second example is the complex value of amplitude component equal to 1 and phase component equal to zero, i.e. vector complex value [1,0].

E126:

Amplitude factor of residual gain error:
$dG(s)\_amp=|iG(s)|-|iG(s\_ref)|$

Phase factor of residual gain error: $dG(s)\_pha$=angle $(iG(s))$-angle($iG(s\_ref)$)

$s=1,\ldots,s\_ref$ (126)

Performing analysis on common update period, it is determined that coefficient update and concatenation in updating procedure can be performed and summarized in the following steps.

In a first step, the common update period is analysed.

With regard to the first example,
$s\_ref=s\_ref\_pre \Rightarrow s\_com=s\_ref$.

With regard to the second example,
$s\_ref<s\_ref\_pre \Rightarrow s\_com=s\_ref$.

With regard to the third example,
$s\_ref>s\_ref\_pre \Rightarrow s\_com=s\_ref\_pre$.

In a second step, residual gain error is calculated according to the equation E127 as shown below.

E127:

Amplitude factor of residual gain error:
$dG(s)\_amp=|iG(s)|-|iG(s\_com)|$

Phase factor of residual gain error: $dG(s)\_pha$=angle $(iG(s))$-angle($iG(s\_com)$)

$s=1,\ldots,s\_com$ (127)

In a third step, update gain is calculated according to the equation E128 as shown below:

E128:

Amplitude factor of update gain: $uG\_amp(s)$=abs($iG$ $(s\_ref\_pre))*(1+dG\_amp(s)*\alpha)$ Phase factor of update gain: $uG\_pha(s)$=angle($iG$ $(s\_ref\_pre))+dG\ pha(s)*\alpha$ Complex update gain: $uG(s)=uG\_amp(s)*\exp$ $(j*uG\_pha)$ $s=1,\ldots,s\_com$ (128)

In a fourth step, the coefficient is updated and concatenation is performed.

With regard to the first example, the coefficients update is performed by equation E129, and the outputs are used as compensation coefficients.

E129:

$Coef(s,p)=Coef(s,p-1)*uG(s) s=1,\ldots,s\_ref$ (129)

With regard to the second example, the coefficients update is performed by equation E130, and the outputs are used as compensation coefficients.

E 130:

$$Coef(s,p) = \begin{cases} Coef(s, p-1)*uG(s) & s=1,\cdots,s\_ref \\ Coef(s, p-1) & s=s\_ref+1,\cdots,s_{ref\_pre} \end{cases} \quad (130)$$

With regard to the third example, the coefficients update is performed by equation E131, and the outputs are used as compensation coefficients.

E 131:

$$Coef(s,p) = \begin{cases} Coef(s, p-1)*uG(s) & s=1,\cdots,s\_ref\_pre \\ iG(s) & s=(s\_ref\_pre+1),\cdots,s_{ref} \end{cases} \quad (131)$$

As described above, the one of the benefits of the example embodiments is that the updating procedure enables updating compensation coefficients without inconsistency by updating the compensation coefficients based on the coefficient length, even if the coefficient length differs between previous compensation coefficients and current residual gain coefficients.

More specifically, the amplitude component and phase component of residual gain error are calculated individually referenced by residual gain coefficient at the reference symbol position. Then compensation coefficient for common period is determined by multiplying the complex update gain. The complex update gain is determined by a multiplication of update coefficient (step size) to the amplitude component and phase component of the residual gain error. The portion of coefficients that are out of a common update period, and whose length is longer than portions of previous compensation coefficient or current residual gain coefficient, can be combined to the updated coefficient in the common period.

Therefore, a continuous update is obtained by changing the position of the reference gain in each burst due to traffic variation.

In the compensation unit 202 in FIG. 12, GTR is compensated prior to transmission. The GTR is compensated by multiplying the compensation coefficients with the baseband forward signal 210. The compensation coefficients for the GTR is calculated using compensation coefficient series Coef(s,p) for each symbol.

As discussed earlier, compensation coefficient is the inverse characteristic of relative gain calculated form the start symbol to the detected reference symbol. Consequently, a continuous transmission in waveform is provided during the compensation period. The compensation period may include the forward portion of the reference symbol and backward symbol after the compensation period. Accordingly, finite number of coefficients is provided for compensation without increasing in the number of that in accordance with the length of transient response. Regarding the retained compensation coefficients, the last coefficient always converged to [1, 0] leads to enable to update eliminating the problem of the difference of the coefficients length.

The above series of procedure which continuously updates compensation coefficients does not need to be performed in every burst signal. It may be performed periodically or intermediately according to capability of the transmission system, which may depend on the number of transmission antennas, processing performance of the device equipped in the apparatus, more specifically, the number of signal branch dealt with RFIC, processing capability of digital signal processing device such as DPS, FPGA and SoC.

For example, the baseband forward signal 210 is compensated in advance by using the compensation coefficients in the above example embodiments. In the case of DPD is lacked, the signal to be compensated in advance may be output of CFR 312.

The gain transient response compensation circuit described herein is useful especially for the signal of high-order multi-level modulation scheme, such as 256QAM and 1024QAM because GTR is calculated and compensated precisely as shown in FIGS. 9 and 10 above and update compensation coefficients adaptivity as described above.

Figure 27:
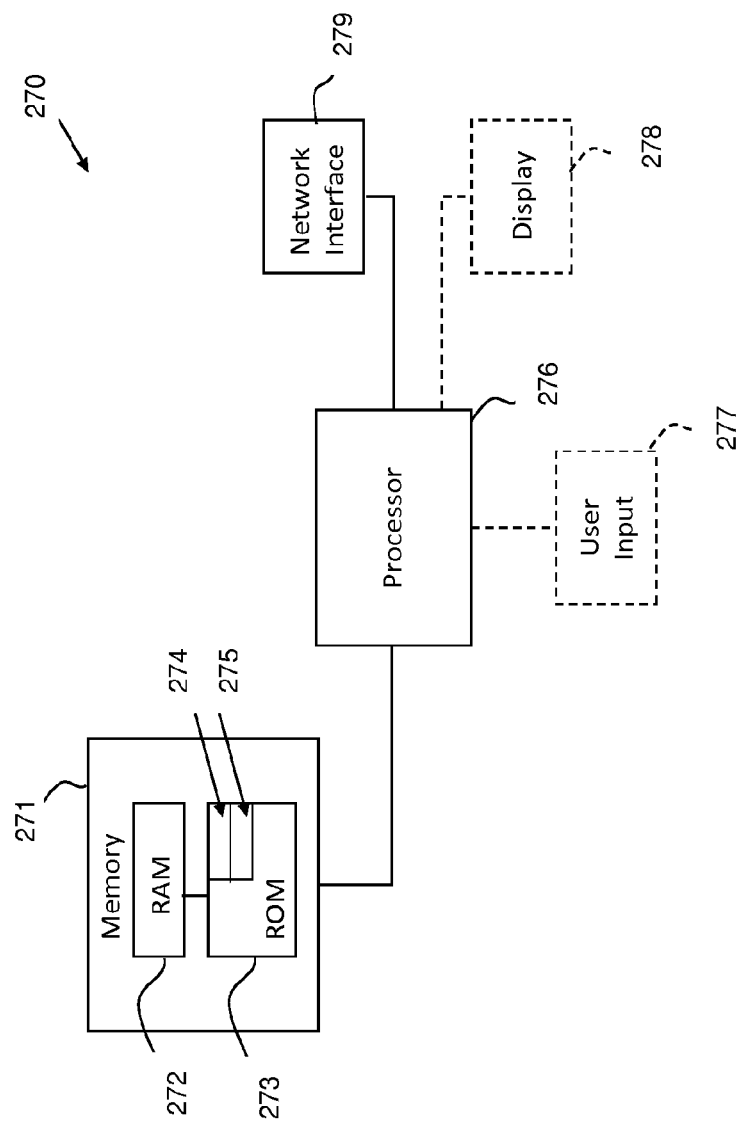
FIG. 27 is a block diagram of a system in accordance with an example embodiment.

For completeness, FIG. 27 is a schematic diagram of components of one or more of the modules for implementing the algorithms described above, which hereafter are referred to generically as processing systems 270. A processing system 270 may have a processor 276, a memory 271 coupled to the processor and comprised of a RAM 272 and ROM 273, and, optionally, user inputs 277 and a display 278. The processing system 270 may comprise one or more network interfaces 279 for connection to a network, e.g. a modem which may be wired or wireless.

The processor 276 is connected to each of the other components in order to control operation thereof.

The memory 271 may comprise a non-volatile memory, a hard disk drive (HDD) or a solid state drive (SSD). The ROM 312 of the memory 273 stores, amongst other things, an operating system 274 and may store software applications 275. The RAM 272 of the memory 271 is used by the processor 276 for the temporary storage of data. The operating system 274 may contain code which, when executed by the processor, implements aspects of the algorithm A15.

The processor 276 may take any suitable form. For instance, it may be a microcontroller, plural microcontrollers, a processor, or plural processors. Processor 302 may comprise processor circuitry.

The processing system 270 may be a standalone computer, a server, a console, or a network thereof.

In some embodiments, the processing system 270 may also be associated with external software applications. These may be applications stored on a remote server device and may run partly or exclusively on the remote server device. These applications may be termed cloud-hosted applications. The processing system 270 may be in communication with the remote server device in order to utilize the software application stored there.

FIG. 28a and FIG. 28b show tangible media, respectively a removable, non-volatile, memory unit 281 and a compact disc (CD) 284, storing computer-readable code which when run by a computer may perform methods according to embodiments described above. The removable memory unit 281 may be a memory stick, e.g. a USB memory stick, having internal memory 283 storing the computer-readable code. The memory 283 may be accessed by a computer system via a connector 282. The CD 284 may be a CD-ROM or a DVD or similar. Other forms of tangible storage media may be used.

Embodiments of the present invention may be implemented in software, hardware, application logic or a combination of software, hardware and application logic. The software, application logic and/or hardware may reside on memory, or any computer media. In an example embodiment, the application logic, software or an instruction set is maintained on any one of various conventional computer-readable media. In the context of this document, a "memory" or "computer-readable medium" may be any non-transitory media or means that can contain, store, communicate, propagate or transport the instructions for use by or in connection with an instruction execution system, apparatus, or device, such as a computer.

Reference to, where relevant, "computer-readable storage medium", "computer program product", "tangibly embodied computer program" etc., or a "processor" or "processing circuitry" etc. should be understood to encompass not only computers having differing architectures such as single/multi-processor architectures and sequencers/parallel architectures, but also specialised circuits such as field programmable gate arrays FPGA, application specify circuits ASIC, signal processing devices and other devices. References to computer program, instructions, code etc. should be understood to express software for a programmable processor firmware such as the programmable content of a hardware device as instructions for a processor or configured or configuration settings for a fixed function device, gate array, programmable logic device, etc.

As used in this application, the term "circuitry" refers to all of the following: (a) hardware-only circuit implementations (such as implementations in only analogue and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a server, to perform various functions) and (c) to circuits, such as a microprocessor(s) or a portion of a microprocessor(s), that require software or firmware for operation, even if the software or firmware is not physically present.

If desired, the different functions discussed herein may be performed in a different order and/or concurrently with each other. Furthermore, if desired, one or more of the above-described functions may be optional or may be combined. Similarly, it will also be appreciated that the flow diagram of FIG. 1b is an example only and that various operations depicted therein may be omitted, reordered and/or combined.

It will be appreciated that the above described example embodiments are purely illustrative and are not limiting on the scope of the invention. Other variations and modifications will be apparent to persons skilled in the art upon reading the present specification.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes various examples, these descriptions should not be viewed in a limiting sense. Rather, there are several variations and modifications which may be made without departing from the scope of the present invention as defined in the appended claims.

The invention claimed is:

1. An apparatus, comprising:
   at least one processor; and
   at least one memory including computer program code;
   the at least one memory and the computer program code configured to, with the at least one processor, cause the apparatus to perform at least
   determining an absolute gain of a power amplifier over time, wherein the absolute gain is formed from the division of a feedback baseband signal derived from an output of the power amplifier by a forward baseband signal that is used to form an input of the power amplifier;
   determining a relative gain transient response of the power amplifier, by normalizing the absolute gain to generate a relative gain of the power amplifier over time; and
   determining a gain transient response compensation coefficient having inverse characteristics to the relative gain transient response.

2. The apparatus as claimed in claim 1, wherein the at least one memory and the computer program code are further configured to, with the at least one processor, cause the apparatus to averaging the division of the feedback baseband signal by the forward baseband signal over successive sample intervals.

3. The apparatus as claimed in claim 1, wherein the at least one memory and the computer program code are further configured to, with the at least one processor, cause the apparatus to perform normalizing the absolute gain relative to a reference gain.

4. The apparatus as claimed in claim 3, wherein the reference gain is determined at a time at which the absolute gain is deemed to have settled.

5. The apparatus as claimed in claim 3, wherein the reference gain is determined at a time at which the absolute gain is determined to have settled.

6. The apparatus as claimed in claim 5, wherein the at least one memory and the computer program code are further configured to, with the at least one processor, cause the apparatus to perform determining a time at which the absolute gain is determined to have settled, and to perform reference detection by determining a sample period during which power levels of the forward baseband signal have maximal stability.

7. The apparatus as claimed in claim 1, further wherein the at least one memory and the computer program code are further configured to, with the at least one processor, cause the apparatus to perform modifying a baseband forward signal using the determined gain transient response compensation coefficient to generate a compensated baseband forward signal.

8. The apparatus as claimed in claim 7, wherein the baseband forward signal is multiplied by the determined gain transient response compensation coefficient to generate the compensated baseband forward signal.

9. The apparatus as claimed in claim 1, further wherein the at least one memory and the computer program code are further configured to, with the at least one processor, cause the apparatus to perform storing and updating the gain transient response compensation coefficient.

10. The apparatus as claimed in claim 9, wherein the at least one memory and the computer program code are further configured to, with the at least one processor, cause the apparatus to update the gain transient response compensation coefficient depending on a length of a further compensation coefficient.

11. The apparatus as claimed in claim 10, wherein a common update period index (s_com) is determined in accordance with the following relationship of a reference index of previous coefficient (s_ref_pre) and that of current residual gain (s_ref):

$$s\_ref = s\_ref\_pre \Rightarrow s\_com = s\_ref$$

$$s\_ref < s\_ref\_pre \Rightarrow s\_com = s\_ref$$

$$s\_ref > s\_ref\_pre \Rightarrow s\_com = s\_ref\_pre,$$

wherein:
   the gain transient compensation coefficients are updated for the common update period, calculated by using the previous compensation coefficient and the current residual gain in the common update period, where an error of the current residual gain is calculated by the difference from the residual gain of the index (s_com), controlled by multiplying update-coefficient to the error; and
   a portion of coefficients that are out of a common update period, and whose length is longer than portions of previous compensation coefficient or current residual gain coefficient, are combined with the updated coefficients in the common period.

12. The apparatus as claimed in claim 1, wherein the feedback baseband signal comprises a complex signal having in-phase and quadrature components or the forward baseband signal is a complex signal having in-phase and quadrature components, or the baseband forward signal comprises a complex signal having in-phase and quadrature components.

13. The apparatus as claimed in claim 1, wherein the power amplifier comprises an RF signal amplifier unit.

14. The apparatus as claimed in claim 1, wherein the input signal of the apparatus comprises a burst mode signal.

15. A method, comprising:
   determining an absolute gain of a power amplifier over time, wherein the absolute gain is formed from the division of a feedback baseband signal derived from an output of the power amplifier by a forward baseband signal that is used to form an input of the power amplifier;
   determining a relative gain transient response of the power amplifier, by normalizing the absolute gain to generate a relative gain of the power amplifier over time; and
   determining a gain transient response compensation coefficient having inverse characteristics to the relative gain transient response.

16. The method as claimed in claim 15, wherein determining the absolute gain of the power amplifier over time comprises averaging or normalizing the division of the feedback baseband signal by the forward baseband signal over successive sample intervals.

17. The method as claimed in claim 15, further comprising modifying a baseband forward signal using the determined gain transient response compensation coefficient to generate a compensated baseband forward signal.

18. The method as claimed in claim 15, further comprising storing and updating the gain transient response compensation coefficient.

19. A computer program embodied on a non-transitory computer-readable medium, said computer program comprising instructions stored thereon which, when executed in hardware, cause the hardware to perform at least the following:
- determining an absolute gain of a power amplifier over time, wherein the absolute gain is formed from the division of a feedback baseband signal derived from an output of the power amplifier by a forward baseband signal that is used to form an input of the power amplifier;
- determining a relative gain transient response of the power amplifier, by normalizing the absolute gain to generate a relative gain of the power amplifier over time; and
- determining a gain transient response compensation value having inverse characteristics to the relative gain transient response.

* * * * *